United States Patent
Yu et al.

(10) Patent No.: US 10,297,323 B2
(45) Date of Patent: May 21, 2019

(54) REDUCING DISTURBS WITH DELAYED RAMP UP OF DUMMY WORD LINE AFTER PRE-CHARGE DURING PROGRAMMING

(71) Applicant: SanDisk Technologies LLC, Plano, TX (US)

(72) Inventors: Xuehong Yu, San Jose, CA (US); Yingda Dong, San Jose, CA (US)

(73) Assignee: SanDisk Technologies LLC, Addison, TX (US)

( * ) Notice: Subject to any disclaimer, the term of this patent is extended or adjusted under 35 U.S.C. 154(b) by 0 days.

(21) Appl. No.: 15/726,686

(22) Filed: Oct. 6, 2017

(65) Prior Publication Data

US 2019/0108883 A1 Apr. 11, 2019

(51) Int. Cl.
  *G11C 16/04* (2006.01)
  *G11C 16/10* (2006.01)
  *G11C 16/08* (2006.01)

(52) U.S. Cl.
  CPC .......... *G11C 16/10* (2013.01); *G11C 16/0483* (2013.01); *G11C 16/08* (2013.01)

(58) Field of Classification Search
  CPC ................................................ G11C 16/0483
  USPC ..................................................... 365/185.18
  See application file for complete search history.

(56) References Cited

U.S. PATENT DOCUMENTS

| | | | |
|---|---|---|---|
| 7,450,430 B2 * | 11/2008 | Hemink | G11C 11/5628 365/185.17 |
| 8,169,822 B2 | 5/2012 | Dutta et al. | |
| 8,804,430 B2 * | 8/2014 | Lai | G11C 11/5628 365/185.18 |
| 8,988,937 B2 | 3/2015 | Dunga et al. | |
| 9,460,805 B1 * | 10/2016 | Pang | G11C 16/0483 |
| 9,530,506 B2 | 12/2016 | Rabkin et al. | |
| 2008/0137422 A1 * | 6/2008 | Hosono | G11C 16/0483 365/185.17 |
| 2008/0246072 A1 | 10/2008 | Kondo et al. | |
| 2011/0305079 A1 | 12/2011 | Chan et al. | |

(Continued)

FOREIGN PATENT DOCUMENTS

KR 10-0842758 B1 7/2008

OTHER PUBLICATIONS

U.S. Appl. No. 15/403,710, filed Jan. 11, 2017 by Zhang et al.

(Continued)

*Primary Examiner* — Min Huang
(74) *Attorney, Agent, or Firm* — Vierra Magen Marcus LLP

(57) ABSTRACT

A memory device and associated techniques for reducing disturbs of select gate transistors and dummy memory cells in a memory device. In one approach, a ramp up of the voltage of a dummy word line is delayed relative to a ramp up of a voltage of data word lines in a program phase of a program loop, after a pre-charge phase of the program loop. Another possible approach delays the ramp up of a first dummy memory cell while the voltage of a second dummy memory cell is maintained at an elevated level throughout the pre-charge phase and the program phase. In another aspect, the disturb countermeasure is used when the selected data memory cell is relatively close to the source-end of the memory string and phased out when the selected data memory cell is relatively close to the drain-end of the memory string.

16 Claims, 17 Drawing Sheets

(56) References Cited

U.S. PATENT DOCUMENTS

| | | | | |
|---|---|---|---|---|
| 2012/0307561 A1* | 12/2012 | Joo | .................... | G11C 16/0483 |
| | | | | 365/185.17 |
| 2016/0071592 A1* | 3/2016 | Nam | ...................... | G11C 16/16 |
| | | | | 365/185.12 |
| 2018/0151234 A1* | 5/2018 | Cho | .................... | G11C 16/3427 |
| 2018/0158505 A1* | 6/2018 | Lee | ..................... | G11C 11/4076 |
| 2018/0218774 A1* | 8/2018 | Kimura | .................. | G11C 16/08 |

OTHER PUBLICATIONS

International Search Report & The Written Opinion of the International Searching Authority dated Feb. 1, 2019, International Application No. PCT/US2018/052331.

English (Machine) translation of the Abstract and Claims of KR Publication No. KR10-0842758 published on Jul. 1, 2008.

* cited by examiner

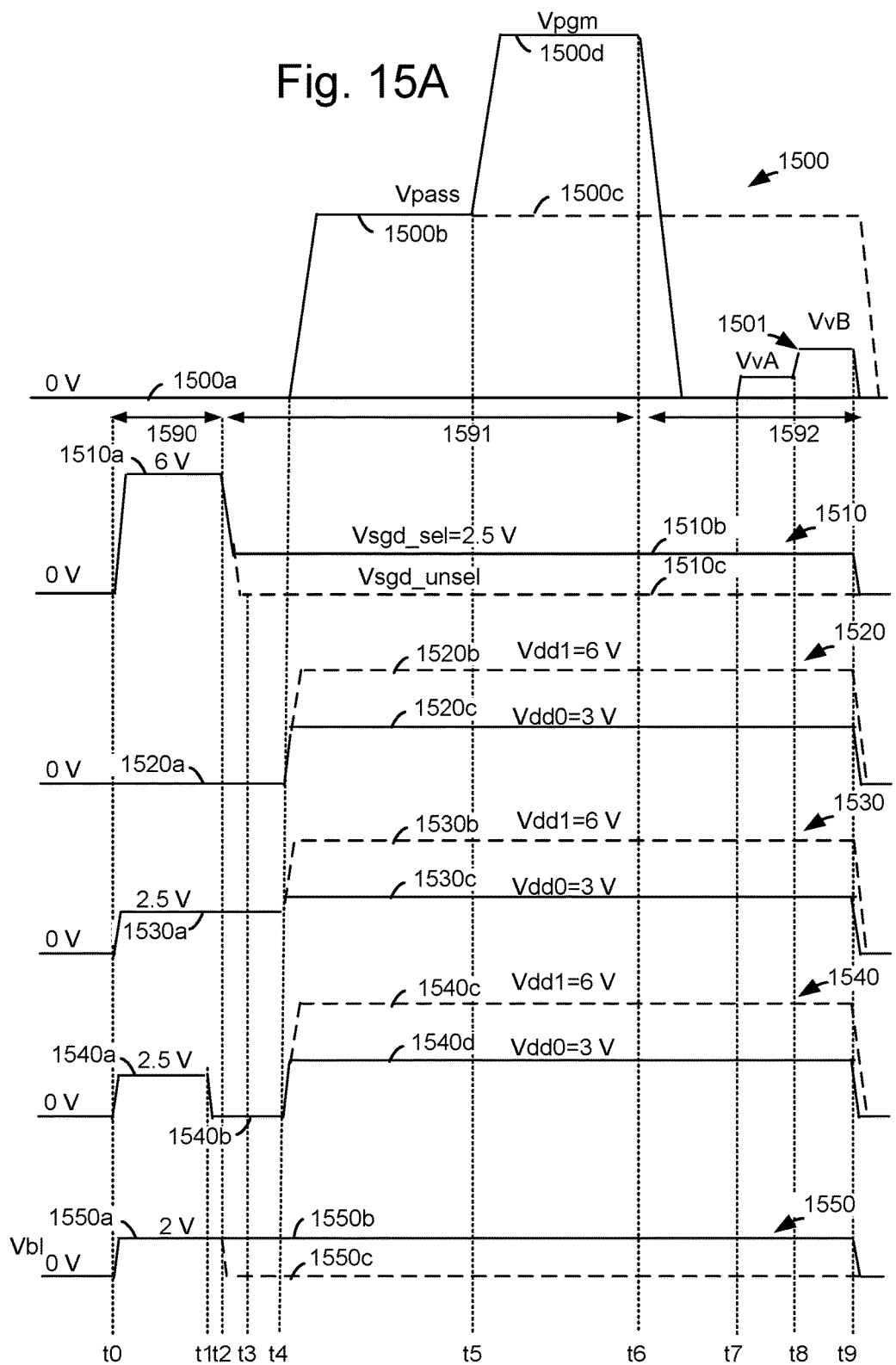

US 10,297,323 B2

REDUCING DISTURBS WITH DELAYED RAMP UP OF DUMMY WORD LINE AFTER PRE-CHARGE DURING PROGRAMMING

BACKGROUND

The present technology relates to the operation of memory devices.

Semiconductor memory devices have become more popular for use in various electronic devices. For example, non-volatile semiconductor memory is used in cellular telephones, digital cameras, personal digital assistants, mobile computing devices, non-mobile computing devices and other devices.

A charge-storing material such as a floating gate or a charge-trapping material can be used in such memory devices to store a charge which represents a data state. A charge-trapping material can be arranged vertically in a three-dimensional (3D) stacked memory structure, or horizontally in a two-dimensional (2D) memory structure. One example of a 3D memory structure is the Bit Cost Scalable (BiCS) architecture which comprises a stack of alternating conductive and dielectric layers.

A memory device includes memory cells which may be arranged in memory strings, for instance, where select gate transistors are provided at the ends of the memory string to selectively connect a channel of the memory string to a source line or bit line. However, various challenges are presented in operating such memory devices.

BRIEF DESCRIPTION OF THE DRAWINGS

FIG. 15A depicts plots of various voltages which can be used in a programming operation consistent with FIGS. 13A and 13B, where a ramp up of Vdd0 is concurrent with a ramp up of Vwl.

DETAILED DESCRIPTION

Apparatuses and techniques are described for reducing disturbs of select gate transistors and dummy memory cells in a memory device.

In some memory devices, memory cells are joined to one another such as in NAND strings in a block or sub-block. Each NAND string comprises a number of memory cells connected in series between one or more drain-end select gate transistors (referred to as SGD transistors), on a drain-end of the NAND string which is connected to a bit line, and one or more source-end select gate transistors (referred to as SGS transistors), on a source-end of the NAND string or other memory string which is connected to a source line. Further, the memory cells can be arranged with a common control gate line (e.g., word line) which acts a control gate. A set of word lines extends from the source side of a block to the drain side of a block. Memory cells can be connected in other types of strings and in other ways as well.

In a 3D memory structure, the memory cells may be arranged in vertical memory strings in a stack, where the stack comprises alternating conductive and dielectric layers. The conductive layers act as word lines which are connected to the memory cells. Each memory string may have the shape of a pillar which intersects with the word lines to form the memory cells.

The memory cells can include data memory cells, which are eligible to store user data, and dummy or non-data memory cells which are ineligible to store user data. A dummy word line is connected to a dummy memory cell. One or more dummy memory cells may be provided at the drain and/or source ends of a string of memory cells to provide a gradual transition in the channel voltage gradient.

Figure 14:
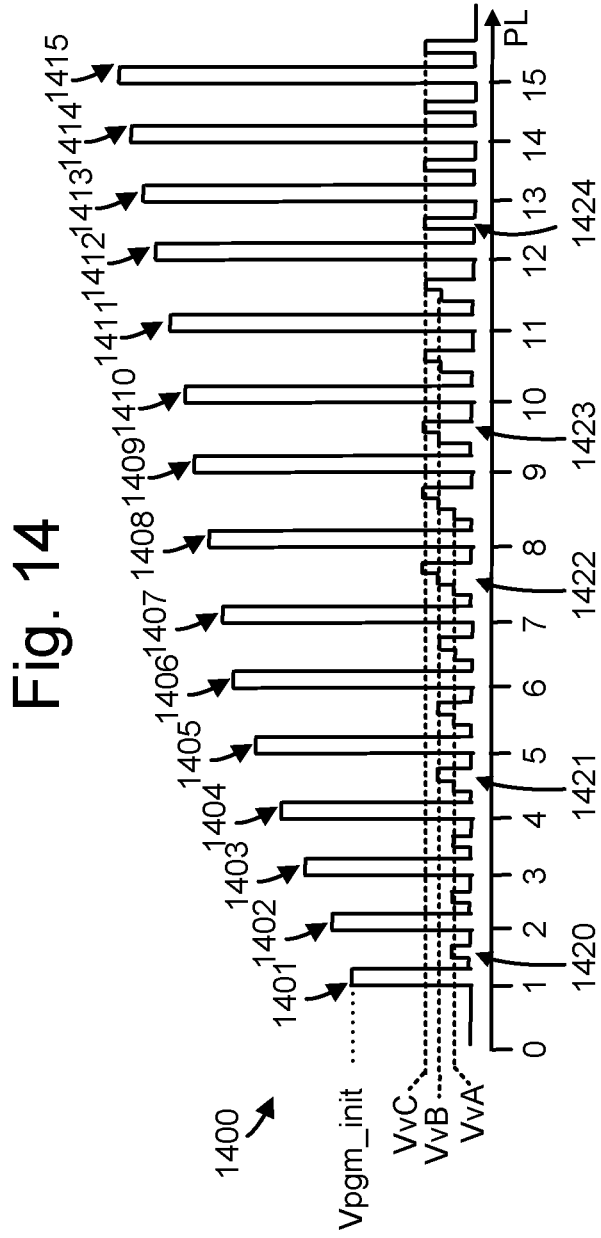
FIG. 14 depicts a series of program loops in an example programming operation, consistent with FIG. 13A.

During a programming operation, the memory cells are programmed according to a word line programming order. For example, the programming may start at the word line at the source side of the block and proceed to the word line at the drain side of the block. In one approach, each word line is completely programmed before programming a next word line. For example, a first word line, WL0, is programmed using one or more programming passes until the programming is completed. Next, a second word line, WL1, is programmed using one or more programming passes until the programming is completed, and so forth. A programming pass may include a set of increasing program voltages which are applied to the word line in respective program loops or program-verify iterations, such as depicted in FIG. 14. Verify operations may be performed after each program voltage to determine whether the memory cells have completed programming. When programming is completed for a memory cell, it can be locked out from further programming while programming continues for other memory cells in subsequent program loops.

The memory cells may also be programmed according to a sub-block programming order, where memory cells connected to a word line are programmed in one sub-block, then a next sub-block and so forth.

Each memory cell may be associated with a data state according to write data in a program command. Based on its data state, a memory cell will either remain in the erased state or be programmed to a programmed data state. For example, in a one bit per cell memory device, there are two data states including the erased state and the programmed state. In a two-bit per cell memory device, there are four data states including the erased state and three higher data states referred to as the A, B and C data states (see FIG. 11). In a three-bit per cell memory device, there are eight data states including the erased state and seven higher data states referred to as the A, B, C, D, E, F and G data states (see FIG. 12). In a four-bit per cell memory device, there are sixteen data states including the erased state and fifteen higher data states. The data states may be referred to as the S0-S15 data states where S0 is the erased state.

After the memory cells are programmed, the data can be read back in a read operation. A read operation can involve applying a series of read voltages to a word line while sensing circuitry determines whether cells connected to the word line are in a conductive or non-conductive state. If a cell is in a non-conductive state, the Vth of the memory cell exceeds the read voltage. The read voltages are set at levels which are expected to be between the threshold voltage levels of adjacent data states. During the read operation, the voltages of the unselected word lines are ramped up to a read pass level which is high enough to place the unselected data and dummy memory cells in a strongly conductive state, to avoid interfering with the sensing of the selected memory cells.

To ensure proper program, erase and read operations in a memory string, the Vth of the SGD transistors and the dummy memory cells should be in a specified range. However, it has been observed that the Vth can increase over time due to disturbs. Specifically, at the end of a pre-charge phase of a program loop of a program operation, a channel gradient (plot 950b) is created between the SGD transistor and an adjacent dummy memory cell which results in a disturb or Vth upshift of the SGD transistor. See FIG. 9. In this channel gradient, a channel voltage of the SGD transistor (plot 950c) is greater than a channel voltage of the dummy memory cell (plot 950a). Also, at a start of a program phase of the program loop, a channel gradient is created between the SGD transistor and an adjacent dummy memory cell which results in a disturb of the dummy memory cell. See FIG. 10. In this channel gradient (plot 960d), a channel voltage of the SGD transistor (plot 960e) is lower than a channel voltage of the dummy memory cell (plot 960c). These disturbs can accumulate over time and increase the Vth above an acceptable level.

Techniques provided herein address the above and other issues. In one approach, a ramp up of the voltage of the dummy word line is delayed relative to a ramp up of a voltage of the data word lines in the program phase. See plots 1560, 1570 and 1580 in FIG. 15B. This provides time for the channel voltage of the SGD transistor to increase before the channel voltage of the SGD transistor increases due to the ramp up of the voltage of the SGD transistor, so that the channel gradient (plot 960d) at the end of the pre-charge phase is reduced. The voltage of the data word lines can ramp up without a delay so that the overall programming time is not increased.

However, a disturb may also occur for the drain-side data memory cell 847. To address this, another possible approach involves a first dummy memory cell 845 adjacent to the SGD transistor 842 and connected to a word line WLDD0 and a second dummy memory cell 846 adjacent to the drain-side data word line WLL10 and/or the first dummy memory cell 845 and connected to a dummy word line WLDD1. The first dummy memory cell has a delay in the ramp up of the voltage as described above while the voltage of the second dummy memory cell 846 can be maintained at an elevated level throughout the pre-charge phase and the program phase. See plot 1580 in FIG. 15B. This tends to shift the disturb from the drain-side data memory cell 847 to the second dummy memory cell 846.

In other aspects, the above-mentioned disturb countermeasures are implemented as a function of the position of the selected data memory cell in a memory string. For example, the disturb countermeasure may be used when a position of the selected data memory cell in the memory string is among a subset of memory cells adjacent to a source-end of the memory string but not when the position of the selected data memory cell in the memory string is among a subset of memory cells adjacent to a drain-end of the memory string. This helps avoid a reduction in the channel boosting level during the program phase. In one option, the delay in the ramp up and/or the ramp up rate of the voltage of the dummy memory cells is a function of the selected word line position. See FIGS. 16A and 16B. The peak level of the voltages of the dummy word lines in the pre-charge phase can also be set as a function of the selected word line position. See FIG. 16C.

The strength of the disturb countermeasure can also be adjusted as a function of the position of the selected data memory cell in the memory string. For example, the disturb countermeasure can have a relatively greater strength when the selected data memory cell is relatively close to the source-end of the memory string. See FIG. 16A to 16C.

These and other features are discussed further below.

Figure 1:
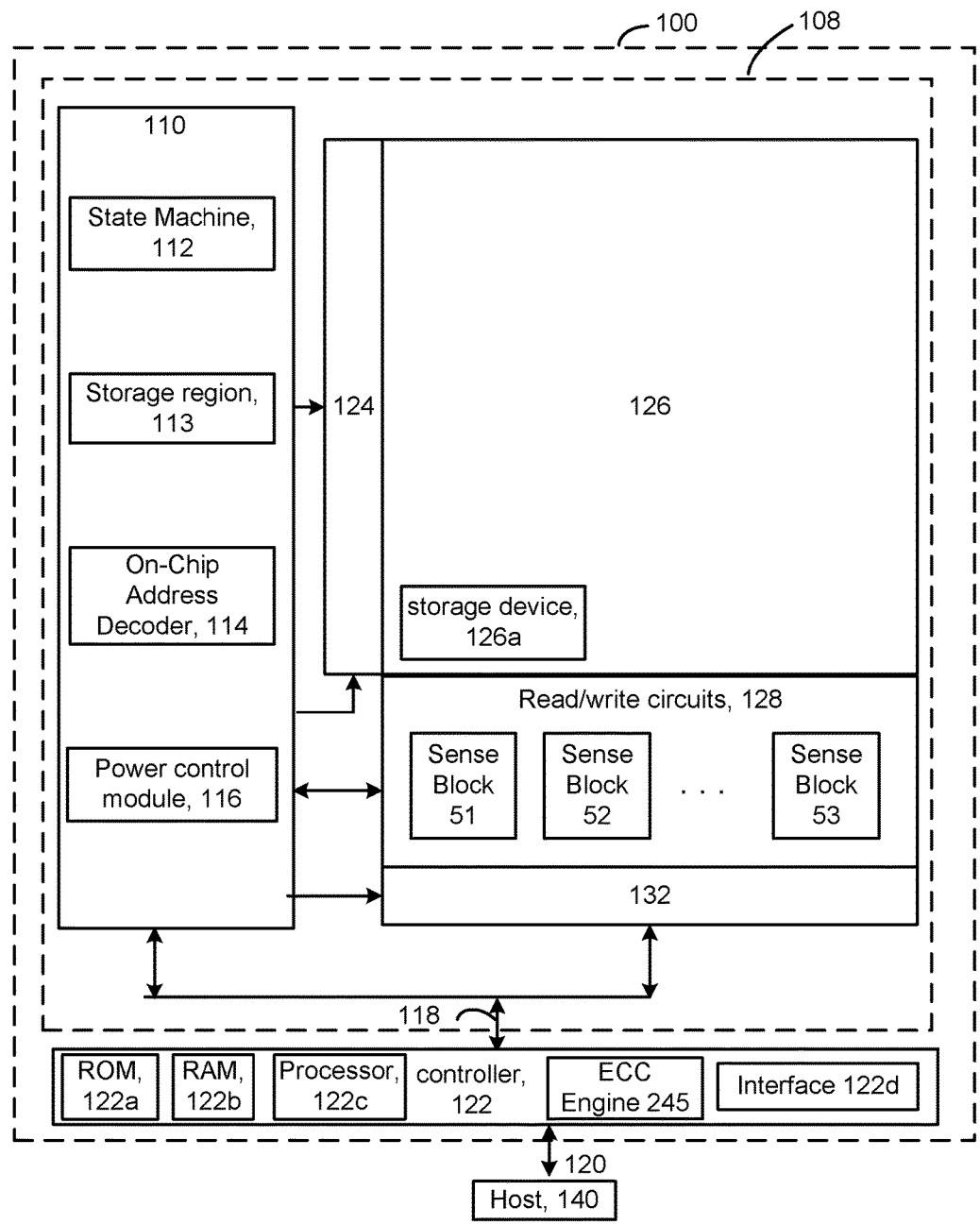
FIG. 1 is a block diagram of an example memory device.

FIG. 1 is a block diagram of an example memory device. The memory device 100, such as a non-volatile storage system, may include one or more memory die 108. The memory die 108 includes a memory structure 126 of memory cells, such as an array of memory cells, control circuitry 110, and read/write circuits 128. The memory structure 126 is addressable by word lines via a row decoder 124 and by bit lines via a column decoder 132. The read/write circuits 128 include multiple sense blocks 51, 52, . . . 53 (sensing circuitry) and allow a page of memory cells to be read or programmed in parallel. Typically a controller 122 is included in the same memory device 100 (e.g., a removable storage card) as the one or more memory die 108. The controller may be separate from the memory die.

Commands and data are transferred between the host 140 and controller 122 via a data bus 120, and between the controller and the one or more memory die 108 via lines 118.

The memory structure can be 2D or 3D. The memory structure may comprise one or more array of memory cells including a 3D array. The memory structure may comprise a monolithic 3D memory structure in which multiple memory levels are formed above (and not in) a single substrate, such as a wafer, with no intervening substrates. The memory structure may comprise any type of non-volatile memory that is monolithically formed in one or more physical levels of arrays of memory cells having an active area disposed above a silicon substrate. The memory structure may be in a non-volatile memory device having circuitry associated with the operation of the memory cells, whether the associated circuitry is above or within the substrate.

The control circuitry 110 cooperates with the read/write circuits 128 to perform memory operations on the memory structure 126, and includes a state machine 112, an on-chip address decoder 114 and a power control module 116. The state machine 112 provides chip-level control of memory operations. A storage region 113 may be provided, e.g., for operational parameters and software/code. In one embodiment, the state machine is programmable by the software. In other embodiments, the state machine does not use software and is completely implemented in hardware (e.g., electrical circuits).

The on-chip address decoder 114 provides an address interface between that used by the host or a memory controller to the hardware address used by the decoders 124 and 132. The power control module 116 controls the power and voltages supplied to the word lines, select gate lines, bit lines and source lines during memory operations. It can include drivers for data and dummy word lines, SGS and SGD transistors and source lines. See also FIG. 4. The sense blocks can include bit line drivers, in one approach.

In some implementations, some of the components can be combined. In various designs, one or more of the components (alone or in combination), other than memory structure 126, can be thought of as at least one control circuit which is configured to perform the techniques described herein including the steps of the processes described herein. For example, a control circuit may include any one of, or a combination of, control circuitry 110, state machine 112, decoders 114 and 132, power control module 116, sense blocks 51, 52, . . . , 53, read/write circuits 128, controller 122, and so forth.

The off-chip controller 122 (which in one embodiment is an electrical circuit) may comprise a processor 122c, storage devices (memory) such as ROM 122a and RAM 122b and an error-correction code (ECC) engine 245. The ECC engine can correct a number of read errors.

A memory interface 122d may also be provided. The memory interface, in communication with ROM, RAM and processor, is an electrical circuit that provides an electrical interface between controller and memory die. For example, the memory interface can change the format or timing of signals, provide a buffer, isolate from surges, latch I/O and so forth. The processor can issue commands to the control circuitry 110 (or any other component of the memory die) via the memory interface 122d.

The storage device comprises code such as a set of instructions, and the processor is operable to execute the set of instructions to provide the functionality described herein. Alternatively or additionally, the processor can access code from a storage device 126a of the memory structure, such as a reserved area of memory cells in one or more word lines.

For example, code can be used by the controller to access the memory structure such as for programming, read and erase operations. The code can include boot code and control code (e.g., a set of instructions). The boot code is software that initializes the controller during a booting or startup process and enables the controller to access the memory structure. The code can be used by the controller to control one or more memory structures. Upon being powered up, the processor 122c fetches the boot code from the ROM 122a or storage device 126a for execution, and the boot code initializes the system components and loads the control code into the RAM 122b. Once the control code is loaded into the RAM, it is executed by the processor. The control code includes drivers to perform basic tasks such as controlling and allocating memory, prioritizing the processing of instructions, and controlling input and output ports.

Generally, the control code can include instructions to perform the functions described herein including the steps of the flowcharts discussed further below, and provide the voltage waveforms including those discussed further below. A control circuit can be configured to execute the instructions to perform the functions described herein.

In one embodiment, the host is a computing device (e.g., laptop, desktop, smartphone, tablet, digital camera) that includes one or more processors, one or more processor readable storage devices (RAM, ROM, flash memory, hard disk drive, solid state memory) that store processor readable code (e.g., software) for programming the one or more processors to perform the methods described herein. The host may also include additional system memory, one or more input/output interfaces and/or one or more input/output devices in communication with the one or more processors.

Other types of non-volatile memory in addition to NAND flash memory can also be used.

Semiconductor memory devices include volatile memory devices, such as dynamic random access memory ("DRAM") or static random access memory ("SRAM") devices, non-volatile memory devices, such as resistive random access memory ("ReRAM"), electrically erasable programmable read only memory ("EEPROM"), flash memory (which can also be considered a subset of EEPROM), ferroelectric random access memory ("FRAM"), and magnetoresistive random access memory ("MRAM"), and other semiconductor elements capable of storing information. Each type of memory device may have different configurations. For example, flash memory devices may be configured in a NAND or a NOR configuration.

The memory devices can be formed from passive and/or active elements, in any combinations. By way of non-limiting example, passive semiconductor memory elements include ReRAM device elements, which in some embodiments include a resistivity switching storage element, such as an anti-fuse or phase change material, and optionally a steering element, such as a diode or transistor. Further by way of non-limiting example, active semiconductor memory elements include EEPROM and flash memory device elements, which in some embodiments include elements containing a charge storage region, such as a floating gate, conductive nanoparticles, or a charge storage dielectric material.

Multiple memory elements may be configured so that they are connected in series or so that each element is individually accessible. By way of non-limiting example, flash memory devices in a NAND configuration (NAND memory) typically contain memory elements connected in series. A NAND string is an example of a set of series-connected transistors comprising memory cells and select gate transistors.

A NAND memory array may be configured so that the array is composed of multiple strings of memory in which a string is composed of multiple memory elements sharing a single bit line and accessed as a group. Alternatively, memory elements may be configured so that each element is individually accessible, e.g., a NOR memory array. NAND and NOR memory configurations are examples, and memory elements may be otherwise configured.

The semiconductor memory elements located within and/or over a substrate may be arranged in two or three dimensions, such as a 2D memory structure or a 3D memory structure.

In a 2D memory structure, the semiconductor memory elements are arranged in a single plane or a single memory device level. Typically, in a 2D memory structure, memory elements are arranged in a plane (e.g., in an x-y direction plane) which extends substantially parallel to a major surface of a substrate that supports the memory elements. The substrate may be a wafer over or in which the layer of the memory elements are formed or it may be a carrier substrate which is attached to the memory elements after they are formed. As a non-limiting example, the substrate may include a semiconductor such as silicon.

The memory elements may be arranged in the single memory device level in an ordered array, such as in a plurality of rows and/or columns. However, the memory elements may be arrayed in non-regular or non-orthogonal configurations. The memory elements may each have two or more electrodes or contact lines, such as bit lines and word lines.

A 3D memory array is arranged so that memory elements occupy multiple planes or multiple memory device levels, thereby forming a structure in three dimensions (i.e., in the x, y and z directions, where the z direction is substantially perpendicular and the x and y directions are substantially parallel to the major surface of the substrate).

As a non-limiting example, a 3D memory structure may be vertically arranged as a stack of multiple 2D memory device levels. As another non-limiting example, a 3D memory array may be arranged as multiple vertical columns (e.g., columns extending substantially perpendicular to the major surface of the substrate, i.e., in the y direction) with each column having multiple memory elements. The columns may be arranged in a 2D configuration, e.g., in an x-y plane, resulting in a 3D arrangement of memory elements with elements on multiple vertically stacked memory planes. Other configurations of memory elements in three dimensions can also constitute a 3D memory array.

By way of non-limiting example, in a 3D NAND memory array, the memory elements may be coupled together to form a NAND string within a single horizontal (e.g., x-y) memory device level. Alternatively, the memory elements may be coupled together to form a vertical NAND string that traverses across multiple horizontal memory device levels. Other 3D configurations can be envisioned wherein some NAND strings contain memory elements in a single memory level while other strings contain memory elements which span through multiple memory levels. 3D memory arrays may also be designed in a NOR configuration and in a ReRAM configuration.

Typically, in a monolithic 3D memory array, one or more memory device levels are formed above a single substrate. Optionally, the monolithic 3D memory array may also have one or more memory layers at least partially within the single substrate. As a non-limiting example, the substrate may include a semiconductor such as silicon. In a monolithic 3D array, the layers constituting each memory device level of the array are typically formed on the layers of the underlying memory device levels of the array. However, layers of adjacent memory device levels of a monolithic 3D memory array may be shared or have intervening layers between memory device levels.

2D arrays may be formed separately and then packaged together to form a non-monolithic memory device having multiple layers of memory. For example, non-monolithic stacked memories can be constructed by forming memory levels on separate substrates and then stacking the memory levels atop each other. The substrates may be thinned or removed from the memory device levels before stacking, but as the memory device levels are initially formed over separate substrates, the resulting memory arrays are not monolithic 3D memory arrays. Further, multiple 2D memory arrays or 3D memory arrays (monolithic or non-monolithic) may be formed on separate chips and then packaged together to form a stacked-chip memory device.

Associated circuitry is typically required for operation of the memory elements and for communication with the memory elements. As non-limiting examples, memory devices may have circuitry used for controlling and driving memory elements to accomplish functions such as programming and reading. This associated circuitry may be on the same substrate as the memory elements and/or on a separate substrate. For example, a controller for memory read-write operations may be located on a separate controller chip and/or on the same substrate as the memory elements.

One of skill in the art will recognize that this technology is not limited to the 2D and 3D exemplary structures described but covers all relevant memory structures within the spirit and scope of the technology as described herein and as understood by one of skill in the art.

Figure 2:
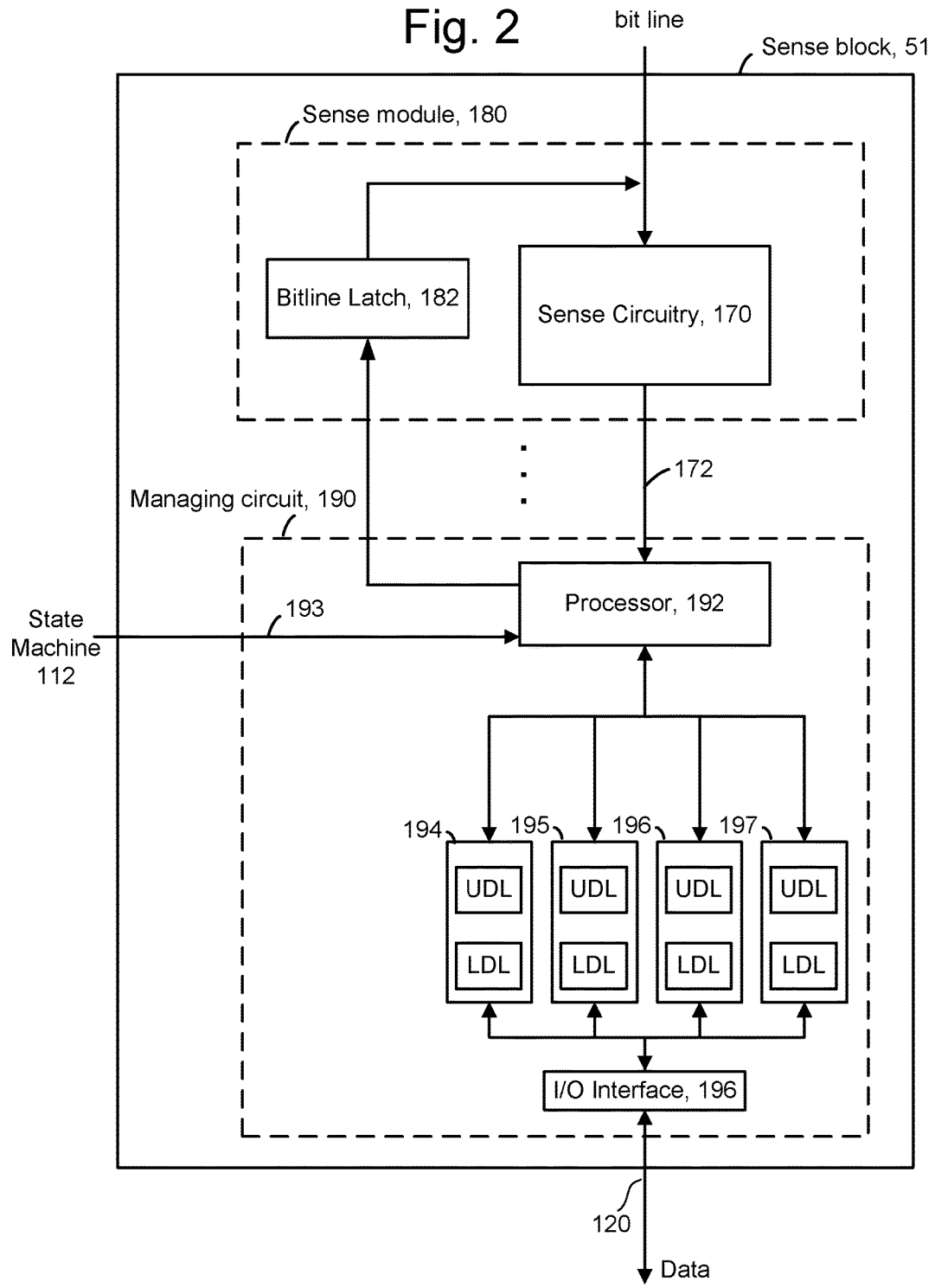
FIG. 2 is a block diagram depicting one embodiment of the sense block 51 of FIG. 1.

FIG. 2 is a block diagram depicting one embodiment of the sense block 51 of FIG. 1. An individual sense block 51 is partitioned into one or more core portions, referred to as sense modules 180 or sense amplifiers, and a common portion, referred to as a managing circuit 190. In one embodiment, there will be a separate sense module 180 for each bit line and one common managing circuit 190 for a set of multiple, e.g., four or eight, sense modules 180. Each of the sense modules in a group communicates with the associated managing circuit via data bus 172. Thus, there are one or more managing circuits which communicate with the sense modules of a set of storage elements.

Sense module 180 comprises sense circuitry 170 that performs sensing by determining whether a conduction current in a connected bit line is above or below a predetermined threshold level. Sense module 180 also includes a bit line latch 182 that is used to set a voltage condition on the connected bit line. For example, a predetermined state latched in bit line latch 182 will result in the connected bit line being pulled to a state designating program inhibit (e.g., 1.5-3 V). As an example, a flag=0 can inhibit programming, while flag=1 does not inhibit programming.

Managing circuit 190 comprises a processor 192, four example sets of data latches 194-197 and an I/O Interface 196 coupled between the set of data latches 194 and data bus 120. One set of data latches can be provide for each sense module, and data latches identified by LDL and UDL may be provided for each set. In some cases, additional data latches may be used. LDL stores a bit for a lower page of data, and UDL stores a bit for an upper page of data. This is in a four-level or two-bits per storage element memory device.

One additional data latch per bit line can be provided for each additional data bit per storage element.

Processor 192 performs computations, such as to determine the data stored in the sensed storage element and store the determined data in the set of data latches. Each set of data latches 194-197 is used to store data bits determined by processor 192 during a read operation, and to store data bits imported from the data bus 120 during a programming operation which represent write data meant to be programmed into the memory. I/O interface 196 provides an interface between data latches 194-197 and the data bus 120.

During reading, the operation of the system is under the control of state machine 112 that controls the supply of different control gate voltages to the addressed storage element. As it steps through the various predefined control gate voltages corresponding to the various memory states supported by the memory, the sense module 180 may trip at one of these voltages and a corresponding output will be provided from sense module 180 to processor 192 via bus 172. At that point, processor 192 determines the resultant memory state by consideration of the tripping event(s) of the sense module and the information about the applied control gate voltage from the state machine via input lines 193. It then computes a binary encoding for the memory state and stores the resultant data bits into data latches 194-197. In another embodiment of the managing circuit 190, bit line latch 182 serves double duty, both as a latch for latching the output of the sense module 180 and also as a bit line latch as described above.

Some implementations can include multiple processors 192. In one embodiment, each processor 192 will include an output line (not depicted) such that each of the output lines is wired-OR'd together. In some embodiments, the output lines are inverted prior to being connected to the wired-OR line. This configuration enables a quick determination during the program verification process of when the programming process has completed because the state machine receiving the wired-OR can determine when all bits being programmed have reached the desired level. For example, when each bit has reached its desired level, a logic zero for that bit will be sent to the wired-OR line (or a data one is inverted). When all bits output a data 0 (or a data one inverted), then the state machine knows to terminate the programming process. Because each processor communicates with eight sense modules, the state machine needs to read the wired-OR line eight times, or logic is added to processor 192 to accumulate the results of the associated bit lines such that the state machine need only read the wired-OR line one time. Similarly, by choosing the logic levels correctly, the global state machine can detect when the first bit changes its state and change the algorithms accordingly.

During program or verify operations, the data to be programmed (write data) is stored in the set of data latches 194-197 from the data bus 120, in the LDL and UDL latches, in a two-bit per storage element implementation. In a three-bit per storage element implementation, an additional data latch may be used. The programming operation, under the control of the state machine, comprises a series of programming voltage pulses applied to the control gates of the addressed storage elements. Each program pulse is followed by a read back (verify) to determine if the storage element has been programmed to the desired memory state. In some cases, processor 192 monitors the read back memory state relative to the desired memory state. When the two are in agreement, the processor 192 sets the bit line latch 182 so as to cause the bit line to be pulled to a state designating program inhibit. This inhibits the storage element coupled to the bit line from further programming even if program pulses appear on its control gate. In other embodiments the processor initially loads the bit line latch 182 and the sense circuitry sets it to an inhibit value during the verify process.

Each set of data latches 194-197 may be implemented as a stack of data latches for each sense module. In one embodiment, there are three data latches per sense module 180. In some implementations, the data latches are implemented as a shift register so that the parallel data stored therein is converted to serial data for data bus 120, and vice versa. All the data latches corresponding to the read/write block of storage elements can be linked together to form a block shift register so that a block of data can be input or output by serial transfer. In particular, the bank of read/write modules is adapted so that each of its set of data latches will shift data in to or out of the data bus in sequence as if they are part of a shift register for the entire read/write block.

The data latches identify when an associated storage element has reached certain mileposts in a programming operations. For example, latches may identify that a storage element's Vth is below a particular verify level. The data latches indicate whether a storage element currently stores one or more bits from a page of data. For example, the LDL latches can be used to store a lower page of data. An LDL latch is flipped (e.g., from 0 to 1) when a lower page bit is stored in an associated storage element. A UDL latch is flipped when an upper page bit is stored in an associated storage element. This occurs when an associated storage element completes programming, e.g., when its Vth exceeds a target verify level such as VvA, VvB or VvC.

Figure 3:
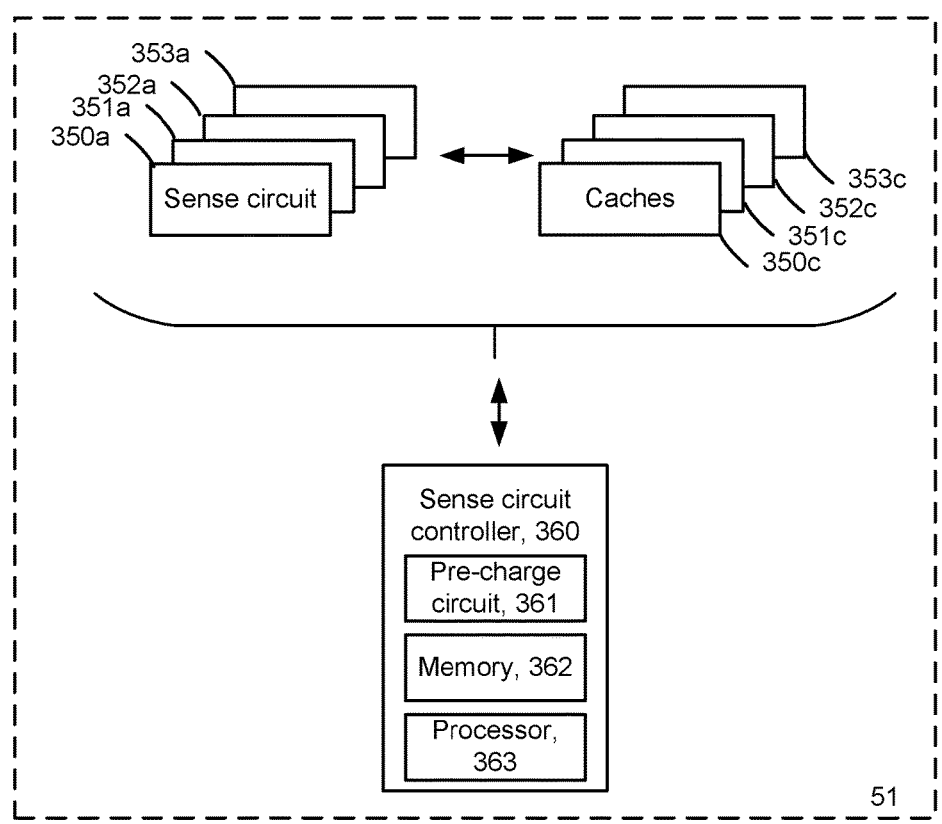
FIG. 3 depicts another example block diagram of the sense block 51 of FIG. 1.

FIG. 3 depicts another example block diagram of the sense block 51 of FIG. 1. The column control circuitry can include multiple sense blocks, where each sense block performs sensing, e.g., read, program verify or erase verify operations for multiple memory cells via respective bit lines. In one approach, a sense block comprises multiple sense circuits, also referred to as sense amplifiers. Each sense circuit is associated with data latches and caches. For example, the example sense circuits 350a, 351a, 352a and 353a are associated with caches 350c, 351c, 352c and 353c, respectively.

In one approach, different subsets of bit lines can be sensed using different respective sense blocks. This allows the processing load which is associated with the sense circuits to be divided up and handled by a respective processor in each sense block. For example, a sense circuit controller 360 can communicate with the set, e.g., sixteen, of sense circuits and latches. The sense circuit controller may include a pre-charge circuit 361 which provides a voltage to each sense circuit for setting a pre-charge voltage. The sense circuit controller may also include a memory 362 and a processor 363.

Figure 4:
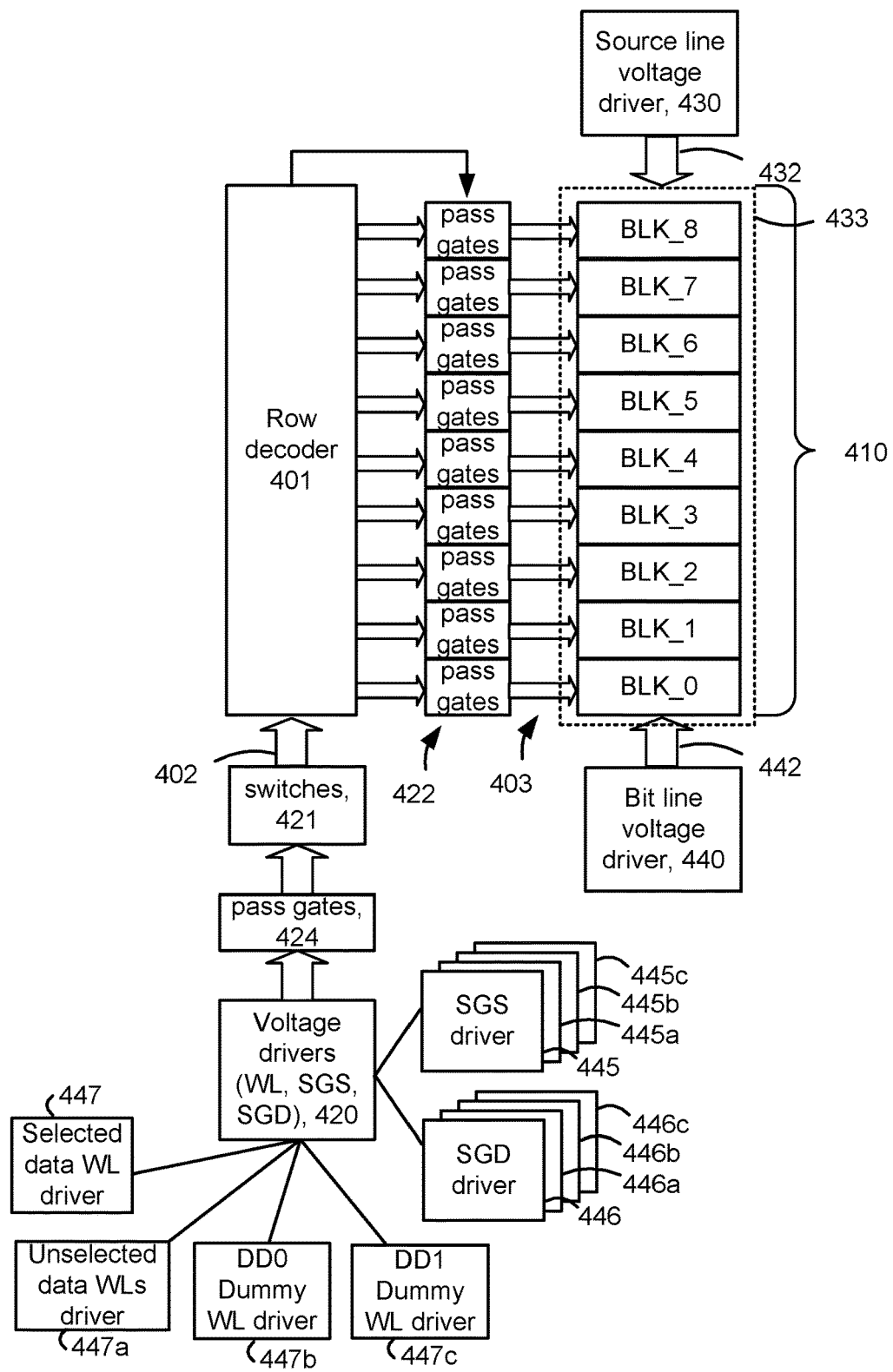
FIG. 4 depicts an example circuit for providing voltages to blocks of memory cells.

FIG. 4 depicts an example circuit for providing voltages to blocks of memory cells. In this example, a row decoder 401 provides voltages to word lines and select gates of each block in set of blocks 410. The set could be in a plane and includes blocks BLK_0 to BLK_8. The row decoder provides a control signal to pass gates 422 which connect the blocks to the row decoder. Typically, operations, e.g., program, read or erase, are performed on one selected block at a time. The row decoder can connect global control lines 402 to local control lines 403. The control lines represent conductive paths. Voltages are provided on the global control lines from voltage drivers 420. The voltage sources or drivers may provide voltages to switches 421 which connect to the global control lines. Pass gates 424 are controlled to pass voltages from the voltage drivers 420 to the switches 421.

The voltage drivers 420 can provide voltages on word lines (WL), SGS control gates and SGD control gates, for example. Specifically, the voltage drivers 420 can include separate SGS and SGD drivers for each sub-block. For example, SGS drivers 445, 445a, 445b and 445c, and SGD drivers 446, 446a, 446b and 446c can be provided for SB0, SB1, SB2 and SB3, respectively, such as in FIGS. 7 and 8. The voltage drivers can also include a selected data WL driver 447, an unselected data WLs driver 447a, and a dummy WL driver 447b. In some case, different dummy word limes can be driven at different levels.

The various components, including the row decoder, may receive commands from a controller such as the state machine 112 or the controller 122 to perform the functions described herein.

A source line voltage driver 430 provides the voltage Vsl to the source lines/diffusion region in the substrate via control lines 432. For example, an erase voltage can be provided to the substrate in an erase operation. In one approach, the source diffusion region 433 is common to the blocks. A set of bit lines 442 is also shared by the blocks. A bit line voltage driver 440 provides voltages to the bit lines.

Figure 5:
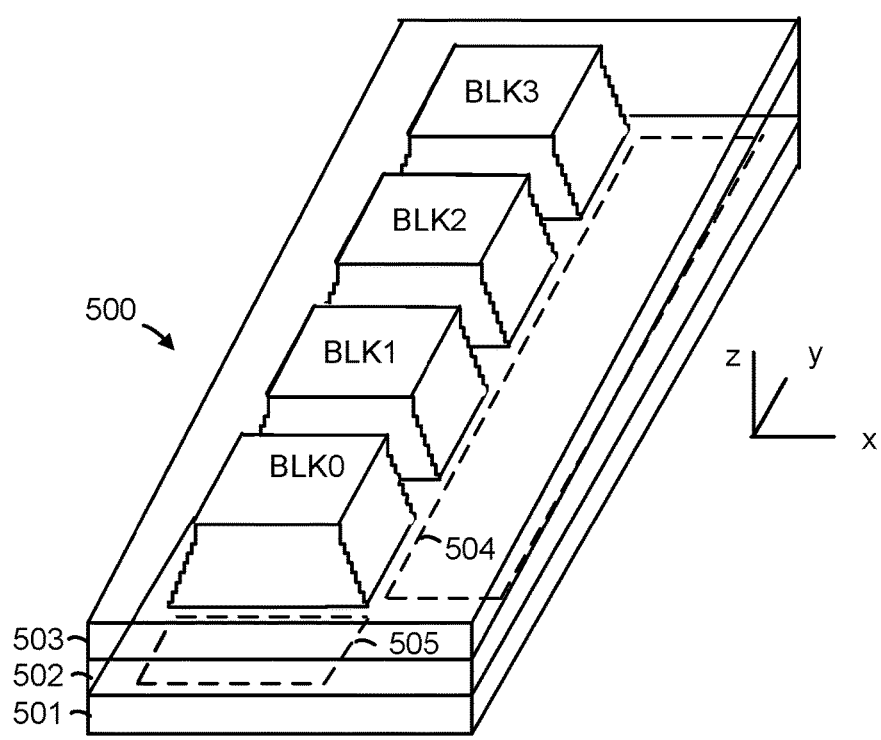
FIG. 5 is a perspective view of a memory device 500 comprising a set of blocks in an example 3D configuration of the memory structure 126 of FIG. 1.

FIG. 5 is a perspective view of a memory device 500 comprising a set of blocks in an example 3D configuration of the memory structure 126 of FIG. 1. On the substrate are example blocks BLK0, BLK1, BLK2 and BLK3 of memory cells (storage elements) and peripheral areas with circuitry for use by the blocks. The peripheral area 504 runs along an edge of each block while the peripheral area 505 is at an end of the set of blocks. The pass gates for a voltage driver of the SGS transistors may be located in this peripheral area 505, in one approach. In this case, the blocks BLK0, BLK1, BLK2 and BLK3 are at progressively further distances from the pass gates. The circuitry can include voltage drivers which can be connected to control gate layers, bit lines and source lines of the blocks. In one approach, control gate layers at a common height in the blocks are commonly driven. The substrate 501 can also carry circuitry under the blocks, and one or more lower metal layers which are patterned in conductive paths to carry signals of the circuitry. The blocks are formed in an intermediate region 502 of the memory device. In an upper region 503 of the memory device, one or more upper metal layers are patterned in conductive paths to carry signals of the circuitry. Each block comprises a stacked area of memory cells, where alternating levels of the stack represent word lines. In one possible approach, each block has opposing tiered sides from which vertical contacts extend upward to an upper metal layer to form connections to conductive paths. While four blocks are depicted as an example, two or more blocks can be used, extending in the x- and/or y-directions.

In one possible approach, the blocks are in a plane, and the length of the plane, in the x-direction, represents a direction in which signal paths to word lines extend in the one or more upper metal layers (a word line or SGD line direction), and the width of the plane, in the y-direction, represents a direction in which signal paths to bit lines extend in the one or more upper metal layers (a bit line direction). The z-direction represents a height of the memory device. The blocks could also be arranged in multiple planes.

Figure 6A:
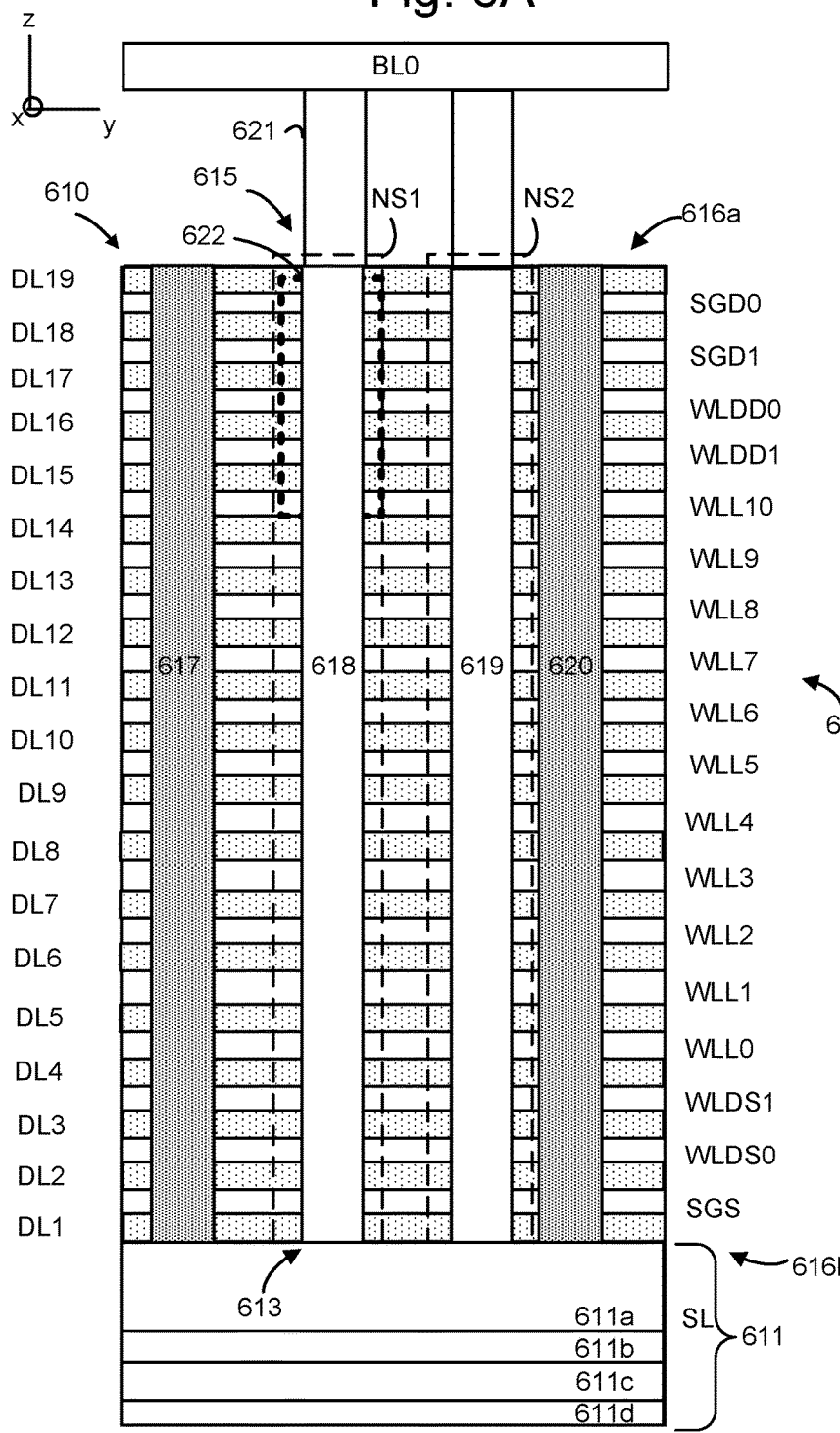
FIG. 6A depicts an example cross-sectional view of a portion of one of the blocks of FIG. 5.

FIG. 6A depicts an example cross-sectional view of a portion of one of the blocks of FIG. 5. The block comprises a stack 610 of alternating conductive and dielectric layers. In this example, the conductive layers comprise two SGD layers, one SGS layer, two source side dummy word line layers (or word lines) WLDS1 and WLDS0, two drain side dummy word line layers WLDD1 and WLDD0, and eleven data word line layers (or data word lines) WLL0-WLL10. WLL0 is a source side data word line and WLDS1 is a dummy word line layer which is adjacent to the source side data word line. WLDS0 is another dummy word line layer which is adjacent to WLDS1. WLL10 is a drain side data word line and WLDD1 is a dummy word line layer which is adjacent to the drain side data word line. WLDD0 is another dummy word line layer which is adjacent to WLDD1. The dielectric layers are labelled as DL1-1L19. Further, regions of the stack which comprise NAND strings NS1 and NS2 are depicted. Each NAND string encompasses a memory hole 618 or 619 which is filled with materials which form memory cells adjacent to the word lines. Region 622 of the stack is shown in greater detail in FIG. 6C.

The stack includes a substrate 611. In one approach, a portion of the source line SL comprises an n-type source diffusion layer 611a in the substrate which is in contact with a source end of each string of memory cells in a block. An erase voltage may be applied to this layer in an erase operation The n-type source diffusion layer 611a is formed in a p-type well region 611b, which in turn is formed in an n-type well region 611c, which in turn is formed in a p-type semiconductor substrate 611d, in one possible implementation. The n-type source diffusion layer may be shared by all of the blocks in a plane, in one approach.

NS1 has a source-end 613 at a bottom 616b of the stack 616 and a drain-end 615 at a top 616a of the stack. Metal-filled slits 617 and 620 may be provided periodically across the stack as interconnects which extend through the stack, such as to connect the source line to a line above the stack. The slits may be used during the formation of the word lines and subsequently filled with metal. A portion of a bit line BL0 is also depicted. A conductive via 621 connects the drain-end 615 to BL0.

In one approach, the block of memory cells comprises a stack of alternating control gate and dielectric layers, and the memory cells are arranged in vertically extending memory holes in the stack.

In one approach, each block comprises a terraced edge in which vertical interconnects connect to each layer, including the SGS, WL and SGD layers, and extend upward to horizontal paths to voltage drivers.

Figure 6B:
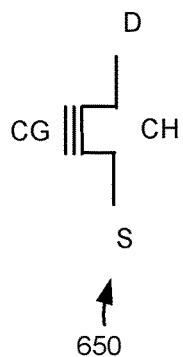
FIG. 6B depicts an example transistor 650.

FIG. 6B depicts an example transistor 650. The transistor comprises a control gate CG, a drain D, a source S and a channel CH and may represent a memory cell or a select gate transistor, for example.

Figure 6C:
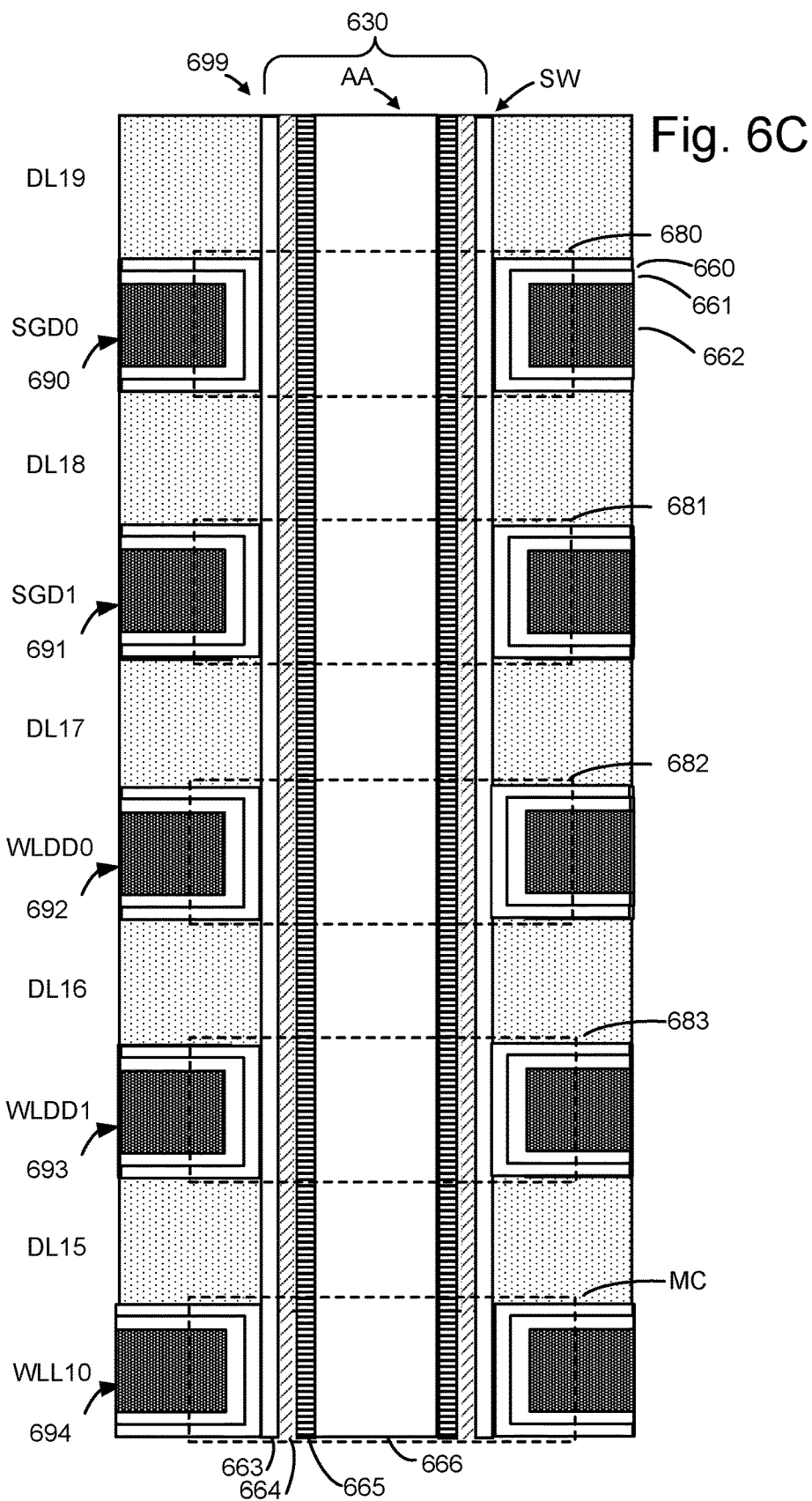
FIG. 6C depicts a close-up view of the region 622 of the stack of FIG. 6A.

FIG. 6C depicts a close-up view of the region 622 of the stack of FIG. 6A. Memory cells are formed at the different levels of the stack at the intersection of a word line layer and a memory hole. In this example, SGD transistors 680 and 681 are provided above dummy memory cells 682 and 683 and a data memory cell MC. A number of layers can be deposited along the sidewall (SW) of the memory hole 630 and/or within each word line layer, e.g., using atomic layer deposition. For example, each pillar 699 or column which is formed by the materials within a memory hole can include a charge-trapping layer 663 or film such as silicon nitride (Si3N4) or other nitride, a tunneling layer 664, a channel 665 (e.g., comprising polysilicon), and a dielectric core 666. A word line layer can include a blocking oxide/block high-k material 660, a metal barrier 661, and a conductive metal 662 such as Tungsten as a control gate. For example, control gates 690, 691, 692, 693 and 694 are provided. In this example, all of the layers except the metal are provided in the memory hole. In other approaches, some of the layers can be in the control gate layer. Additional pillars are similarly formed in the different memory holes. A pillar can form a columnar active area (AA) of a NAND string.

Each memory string comprises a channel which extends continuously from one or more source-end select gate transistors to one or more drain-end select gate transistors.

When a memory cell is programmed, electrons are stored in a portion of the charge-trapping layer which is associated with the memory cell. These electrons are drawn into the charge-trapping layer from the channel, and through the tunneling layer. The Vth of a memory cell is increased in proportion to the amount of stored charge. During an erase operation, the electrons return to the channel.

Each of the memory holes can be filled with a plurality of annular layers comprising a blocking oxide layer, a charge trapping layer, a tunneling layer and a channel layer. A core region of each of the memory holes is filled with a body material, and the plurality of annular layers are between the core region and the word line in each of the memory holes.

The NAND string can be considered to have a floating body channel because the length of the channel is not formed on a substrate. Further, the NAND string is provided by a plurality of word line layers above one another in a stack, and separated from one another by dielectric layers.

Figure 7:
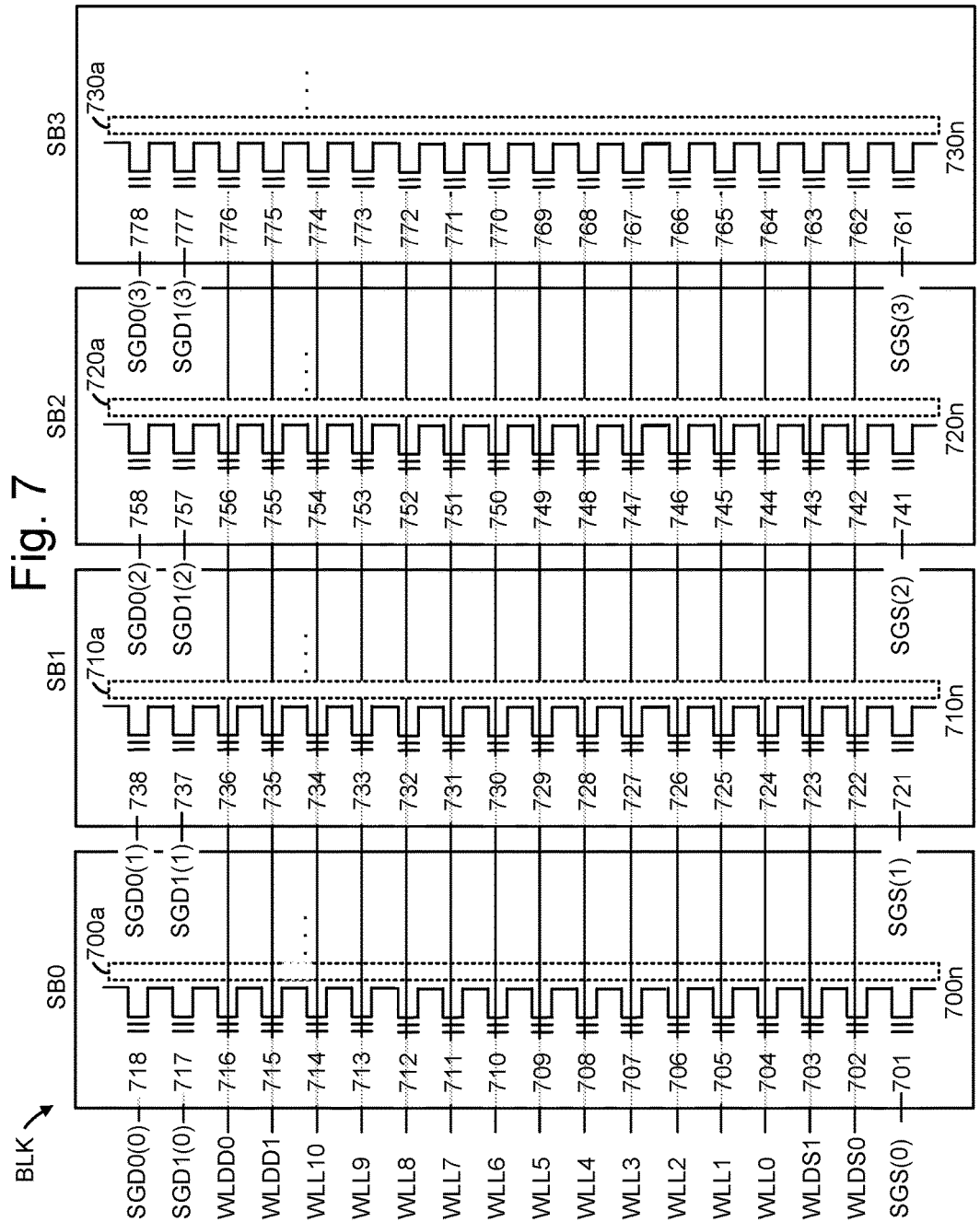
FIG. 7 depicts an example view of NAND strings in sub-blocks in a 3D configuration which is consistent with FIG. 6A.

FIG. 7 depicts an example view of NAND strings in sub-blocks in a 3D configuration which is consistent with FIG. 6A. Each sub-block includes multiple NAND strings, where one example NAND string is depicted. For example, SB0, SB1, SB2 and SB3 comprise example NAND strings 700n, 710n, 720n and 730n, respectively. The NAND strings have data word lines, dummy word lines and select gate lines consistent with FIG. 6A. In a block BLK, each sub-block comprises a set of NAND strings which extend in the x direction and which have a common SGD line. The NAND strings 700n, 710n, 720n and 730n are in sub-blocks SB0, SB1, SB2 and SB3, respectively. Programming of the block may occur based on a word line programming order. One option is to program the memory cells in different portions of a word line which are in the different sub-blocks, one sub-block at a time, before programming the memory cells of the next word line. Another option programs all of the memory cells in one sub-block, one word line at a time, before programming the memory cells of the next sub-block. The word line programming order may start at WL0, the source-end word line and end at WLL10, the drain-end word line, for example.

The NAND strings 700n, 710n, 720n and 730n have channels 700a, 710a, 720a and 730a, respectively.

Additionally, NAND string 700n includes SGS transistor 701, dummy memory cells 702 and 703, data memory cells 704, 705, 706, 707, 708, 709, 710, 711, 712, 713 and 714, dummy memory cells 715 and 716, and SGD transistors 717 and 718.

NAND string 710n includes SGS transistor 721, dummy memory cells 722 and 723, data memory cells 724, 725, 726, 727, 728, 729, 730, 731, 732, 733 and 734, dummy memory cells 735 and 736, and SGD transistors 737 and 738.

NAND string 720n includes SGS transistor 741, dummy memory cells 742 and 743, data memory cells 744, 745, 746, 747, 748, 749, 750, 751, 752, 753 and 754, dummy memory cells 755 and 756, and SGD transistors 757 and 758.

NAND string 730n includes SGS transistor 761, dummy memory cells 762 and 763, data memory cells 764, 765, 766, 767, 768, 769, 770, 771, 772, 773 and 774, dummy memory cells 775 and 776, and SGD transistors 777 and 778.

One or more SGD transistors are provided at the drain-end of each memory string, and one or more SGS transistors are provided at the source-end of each memory string. The SGD transistors in SB0, SB1, SB2 and SB3 may be driven by separate control lines SGD0(0) and SGD1(0), SGD0(1) and SGD1(1), SGD0(2) and SGD1(2), and SGD0(3) and SGD1(3), respectively, in one approach. In another approach, all of the SGD transistors in a sub-block are connected and commonly driven. The SGS transistors in SB0, SB1, SB2 and SB3 may be driven by control lines SGS(0), SGS(1), SGS(2) and SGS(3), respectively.

Figure 8:
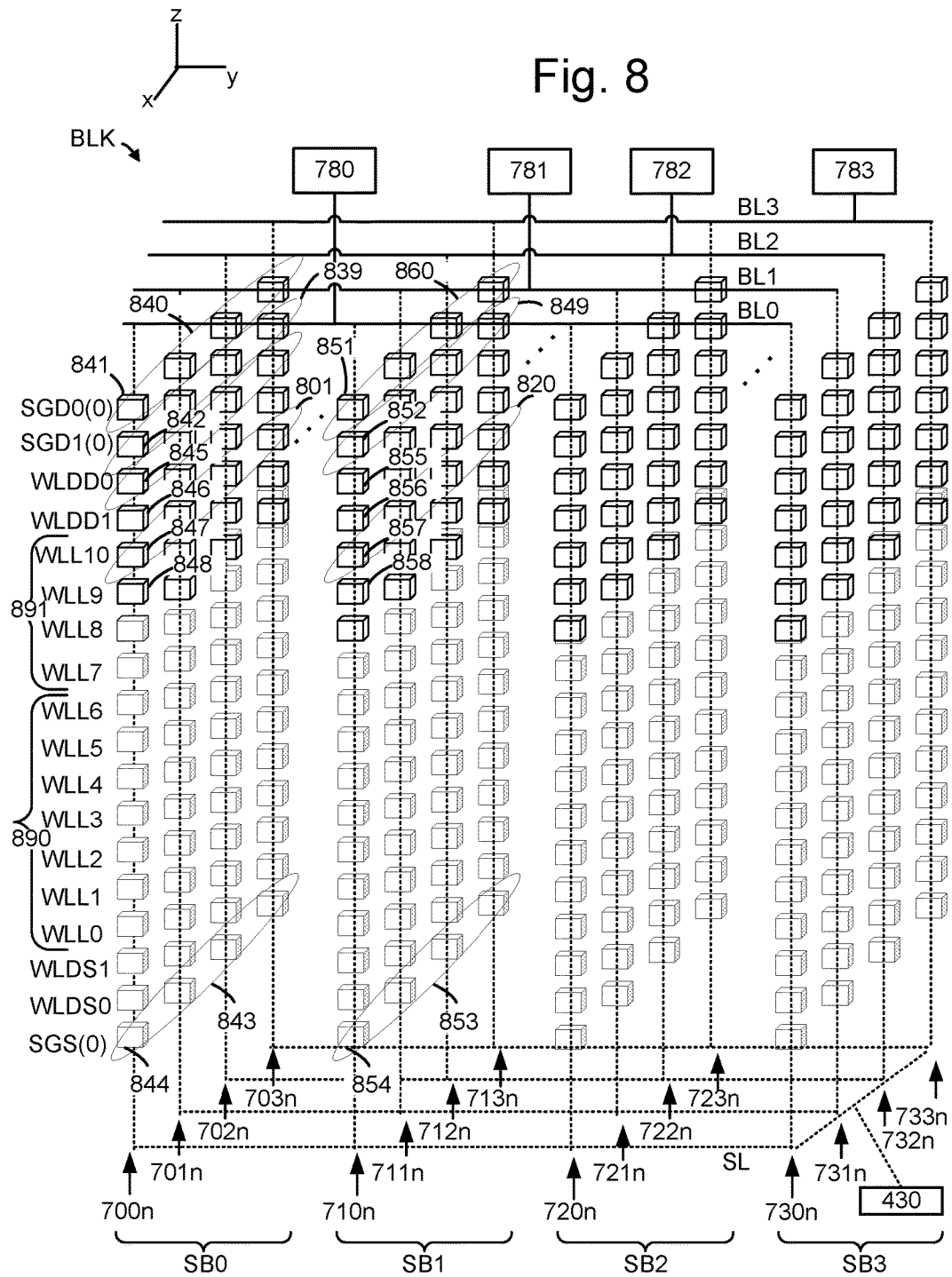
FIG. 8 depicts additional detail of the sub-blocks SB0-SB3 of FIG. 7.

FIG. 8 depicts additional detail of the sub-blocks SB0-SB3 of FIG. 7. Example memory cells are depicted which extend in the x direction along word lines in each sub-block. Each memory cell is depicted as a cube for simplicity. SB0 includes NAND strings 700n, 701n, 702n and 703n. SB1 includes NAND strings 710n, 711n, 712n and 713n. SB2 includes NAND strings 720n, 721n, 722n and 723n. SB3 includes NAND strings 730n, 731n, 732n and 733n. Bit lines are connected to sets of NAND strings. For example, a bit line BL0 is connected to NAND strings 700n, 710n, 720n and 730n, a bit line BL1 is connected to NAND strings 701n, 711n, 721n and 731n, a bit line BL2 is connected to NAND strings 702n, 712n, 722n and 732n, and a bit line BL3 is connected to NAND strings 703n, 713n, 723n and 733n. Sensing circuitry may be connected to each bit line. For example, sensing circuitry 780, 781, 782 and 783 is connected to bit lines BL0, BL1, BL2 and BL3. A bit line voltage driver may be provided with the sensing circuitry.

Programming and reading can occur for selected cells in one word line and one sub-block at a time. This allows each selected cell to be controlled by a respective bit line and/or source line. For example, a set of memory cells 801, which includes an example memory cell 847, is connected to WLL10 in SB0. This is the drain-end data word line. WLL0 is the source-end data word line. A set of memory cells may be programmed or read concurrently. An additional set of memory cells is connected to WLL10 in each of the other sub-blocks SB1-SB3. For example, a set of memory cells 820, which includes an example memory cell 857, is connected to WLL10 in SB1.

In this example, the source line SL or source region is driven at a voltage Vsl by the source line voltage driver 430.

Each memory string includes one or more SGD transistors at the drain-end and one or more SGS transistors at the source end. In this case, there are two SGD transistors and one SGS transistor per string. Each SGD transistor may be connected to separate control line layer, as in FIG. 7, so that it can be driven separately, or the two or more SGD transistors in a string may have their control gates connected and commonly driven. For example, SB0 has sets of SGD transistors 840 and 839, with example SGD transistors 841 and 842, respectively, in the memory string 700n. SB0 also has a set of SGS transistors 843, with an example SGS transistor 844 in the memory string 700n. Similarly, SB1 has sets of SGD transistors 860 and 849, with example SGD transistors 851 and 852, respectively, in the memory string 710n. SB1 also has a set of SGS transistors 853, with an example SGS transistor 854 in the memory string 710n.

The memory string 700n includes SGD transistors 841 and 842 connected to select gate control lines SGD0(0) and SGD1(0), respectively, dummy memory cells 845 and 846 connected to WLDD0 and WLDD1, respectively, and data memory cells 847 and 848 connected to WLL10 and WLL9, respectively. See also FIG. 9A to 9C. The memory string 710n includes SGD transistors 851 and 852 connected to select gate control lines SGD0(1) and SGD1(1) (see FIG. 7), respectively, dummy memory cells 855 and 856 connected to WLDD0 and WLDD1, respectively, and data memory cells 857 and 858 connected to WLL10 and WLL9, respectively.

Figure 16A:
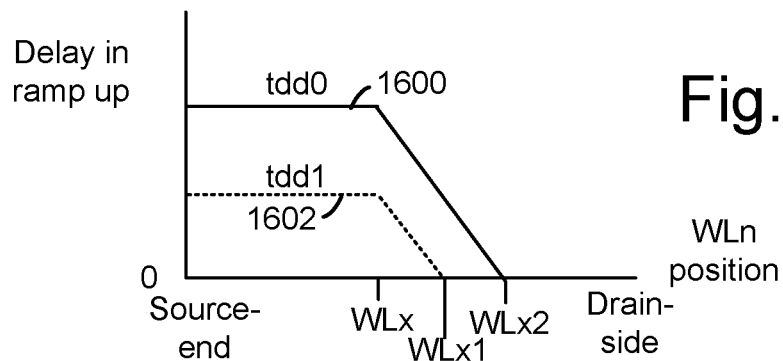
FIG. 16A depicts a plot of a delay in the ramp up of the voltage of a dummy word line relative to a ramp up of the voltage of data word lines during the program phase of a program loop, as a function of a selected word line WLn position, consistent with FIGS. 13A and 13B.
Figure 16B:
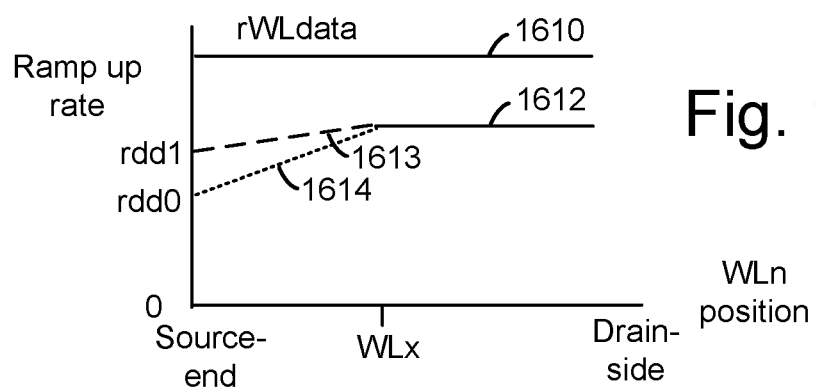
FIG. 16B depicts a plot of a ramp up rate for the ramp up of a voltage of a dummy word line and data word lines during the program phase of a program loop, as a function of a selected word line WLn position, consistent with FIGS. 13A and 13B.
Figure 16C:
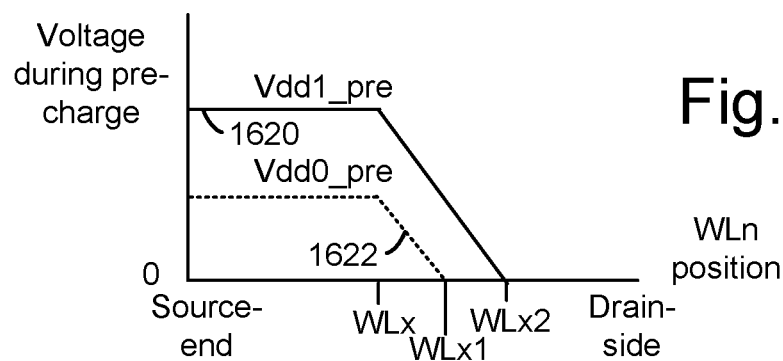
FIG. 16C depicts a plot of a voltage of a dummy word line during the pre-charge of a program phase, as a function of a selected word line WLn position, consistent with FIGS. 13A and 13B.

As described further below, e.g., in FIG. 13A, a decision can be made to perform a disturb countermeasure based on the position of the selected data memory cell among the data memory cells in a memory string (or, similarly, the position of the selected word line WLn among a set of word lines). In one approach, a disturb countermeasure is performed when a position of the selected data memory cell in the memory string is among a subset of memory cells 890 adjacent to a source-end of the memory string, and the disturb countermeasure is not performed when the position of the selected data memory cell in the memory string is among a subset of memory cells 891 adjacent to a drain-end of the memory string. In this example, the memory cells of the subset 890 are connected to WLL0-WLL6 and the memory cells of the subset 891 are connected to WLL7-WLL10. In the examples of FIG. 16A to 16C, a transition word line WLx may be WLL6, WLx1 may be WLL8 and WLx2 may be WLL9. See also FIG. 16A to 16C. The use of eleven data word lines WLL0-WLL10 is a simplified example. In a more realistic example, 48 or 64 word lines might be used, for instance. In the case of 64 word lines WLL0-WLL63, the subset of data memory cells adjacent to the source-end of the memory string could include WLL0-WLL50, and the subset of data memory cells adjacent to the drain-end of the memory string could include WLL51-WLL63. Example values of WLx, WLx1 and WLx2 are WLL50, WLL54 and WLL58, respectively.

Figure 9:
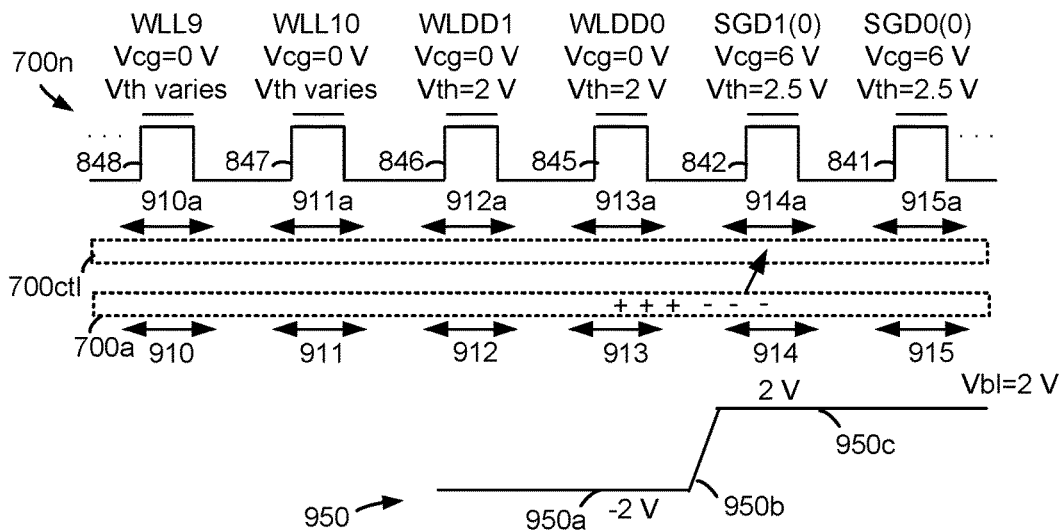
FIG. 9 depicts a portion of the memory string 700n of FIGS. 7 and 8 during a pre-charge phase of a program operation, along with a plot 950 of a voltage in the channel 700a, showing a disturb of the SGD transistor 842.

FIG. 9 depicts a portion of the memory string 700n of FIGS. 7 and 8 during a pre-charge phase of a program operation, along with a plot 950 of a voltage in the channel 700a, showing a disturb of the SGD transistor 842. The plot 950 of the voltage corresponds to a time such as t2 in the pre-charge phase in FIGS. 15A and 15B. The memory string can be in a selected or unselected sub-block.

Figure 10:
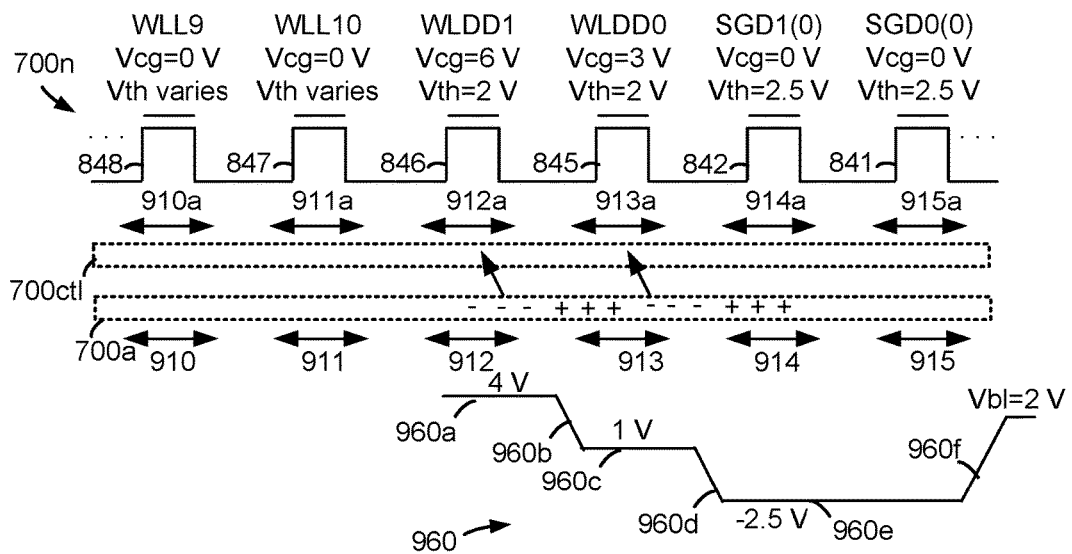
FIG. 10 depicts a plot of the portion of the memory string of FIG. 9A during a program phase of a programming operation, along with a plot 960 of a voltage in the channel 700a, showing a disturb of the dummy memory cell 845.

In FIGS. 9 and 10, a portion of the memory string 700n and its channel 700a and charge trapping layer 700ctl are depicted. See also FIGS. 7 and 8. The portion of the memory string shown includes the SGD transistors 841 and 842 connected to SGD0(0) and SGD1(0), respectively, the dummy memory cells 845 and 846 connected to WLDD0 and WLDD1, respectively, and the data memory cells 847 and 848 connected to WLL10 and WLL9, respectively. The remaining data memory cells and the SGS transistor extend to the left in the figure.

In the memory string 700n, the SGD transistors 841 and 842 are adjacent to channel portions 915 and 914, respectively, and charge trapping layer portions 915a and 914a, respectively. The dummy memory cells 845 and 846 are adjacent to channel portions 913 and 912, respectively, and charge trapping layer portions 913a and 912a, respectively. The data memory cells 847 and 848 are adjacent to channel portions 911 and 910, respectively, and charge trapping layer portions 911a and 910a, respectively. Two drain-end dummy memory cells are provided as an example. In practice, one or more drain-end dummy memory cells can be provided in each memory string. Also, two SGD transistors are provided as an example. In practice, one or more SGD transistors can be provided in each memory string. The drain-end dummy memory cell 845 which is most susceptible to disturb as described herein is adjacent to a SGD transistor 842, and the SGD transistor 842 which is most susceptible to disturb as described herein is adjacent to a dummy memory cell 845.

Each select gate transistor or memory cell has a threshold voltage (Vth) and a control gate or word line voltage. Typical values can include Vth=2.5 V for the SGD transistors and Vth=2 V for the dummy memory cells. The Vth of a data memory cell can vary based on whether the cell is programmed, and if it is programmed, based on its data state. Generally, the programming of the cells is random so that a memory string will have cells in different states.

The disturb scenarios of FIGS. 9 and 10 have been seen in a 3D memory device which comprises a stack of alternating conductive and dielectric layers, such as in the BiCS architecture. In particular, disturbs have been seen for the SGD transistor and the adjacent dummy memory cell after program-erase cycling in the block. It has been found that this occurs during program, during the pre-charge phase, and right after the pre-charge phase finishes, at the start of the program phase. During the pre-charge phase, the dummy word line bias may be kept at a steady state level such as 0 V. As a result, initially the channel potential under DD0 (e.g., WLDD0 or the dummy memory cell 845) is pushed to a low level. This occurs because the Vth of the DD0 dummy memory cells is above 0 V. This is preferred is some situations to improve SGD cycling down-shift behavior. The negative channel potential under the DD0 dummy memory cell (e.g., −2 V) and the positive channel pre-charge potential (e.g., 2 V) under the SGD transistor can cause electron generation and subsequent electron injection into SGD transistor. During pre-charge, if the bias on DD0 is higher, the channel potential difference between DD0 (plot 950a) and SGD (plot 950c) is smaller, and the injection disturb to the SGD transistor is reduced. Accordingly, one approach to reducing a disturb of the SGD transistor is to make the bias on DD0 higher.

In an example scenario, in the pre-charge phase, at t0-t2, assume that the voltages on SGD0(0) and SGD1(0) are driven at 6 V, and that the voltages on WLDD0, WLDD1, WLL10 and WLL9 are driven at Vcg=0 V. See also FIGS. 15A and 15B. With Vbl at a positive level such as 2 V, the SGD transistors are in a conductive state and pass the voltage to the channel portions 914 and 915 (plot 950c). The dummy memory cells are in a non-conductive state such that the channel voltage is about equal to the control gate voltage minus the Vth. Thus, the channel portions 912 and 913 have a voltage of about 0-2=−2 V (see plot 950a). A gradient represented by plot 950b of about 4 V is therefore created. This generates electron-hole pairs in the channel, where the electrons (−) are drawn into the charge trapping layer portion 914a, causing a disturb of the transistor 842. The holes are represented by (+).

At t2-t3, Vsgd is decreased to a level such as 2.5 V for a selected sub-block or 0 V for an unselected sub-block. See FIG. 15A. Also, at t4, Vdd0 and Vdd1 start to ramp up to 3 V and 6 V, respectively, creating the situation of FIG. 10. The voltages provided are examples. Vdd0 and Vdd1 are the voltages on the dummy word lines WLDD0 and WLDD1, respectively. As shown in FIG. 7, WLDD0 may be the top dummy word line in a stack and/or the dummy word line adjacent to an SGD line. The dummy memory cells in WLDD0 are adjacent to SGD transistors. WLDD1 is adjacent to both WLDD0 and the drain-end data word line WLL10, in one approach. Vdd1 may represent the voltage on this word line and any other drain-end dummy word lines, other than WLDD0. For example, there could be a third drain-end dummy word.

FIG. 10 depicts a plot of the portion of the memory string of FIG. 9A during a program phase of a programming operation, along with a plot 960 of a voltage in the channel 700a, showing a disturb of the dummy memory cell 845. The plot 960 of the voltage corresponds to a time such as just after t4 in the program phase of FIGS. 15A and 15B. The memory string can be in an unselected sub-block or the memory string can be an unselected (locked out) memory string in a selected sub-block.

Right after the pre-charge phase, the SGD bias of the unselected sub-blocks returns to 0 V, and subsequently Vdd0 ramps up to about 3 V. At that moment, the channel potential under SGD is pushed down close to about −2.5 V, while the channel potential under DD0 is increased to about 1 V. The channel layer portions 914 and 915 of the SGD transistors become non-conductive at t4 so that the channel voltage is about 0-2.5=−2.5 V (plot 960e). The channel layer portions 912 and 913 are raised to about 6−2=4 V and 3−2=1 V, respectively (plots 960a and 960c, respectively). This channel potential difference can cause electron generation inside the polysilicon channel, leading to hot electron injection into the DD0 dummy memory cell in this case instead of the SGD transistor as in FIG. 9. Specifically, a gradient represented by plot 960d of about 3.5 V is created between the dummy memory cell 845 and the SGD transistor 842. This generates electron-hole pairs, where the electrons are drawn into the charge trapping layer portion 913a, causing a disturb of the dummy memory cell 845. If Vdd0 is lower, the channel potential difference between DD0 and SGD is smaller, and the injection disturb to the DD0 dummy memory cell is reduced. Accordingly, one approach to reducing a disturb of the DD0 dummy memory cell is to reduce Vdd0.

Also, a gradient represented by plot 960b of about 3 V is created between the dummy memory cells 846 and 845. This generates electron-hole pairs, where the electrons are drawn into the charge trapping layer portion 912a, causing a disturb of the dummy memory cell 846.

Figure 15B:
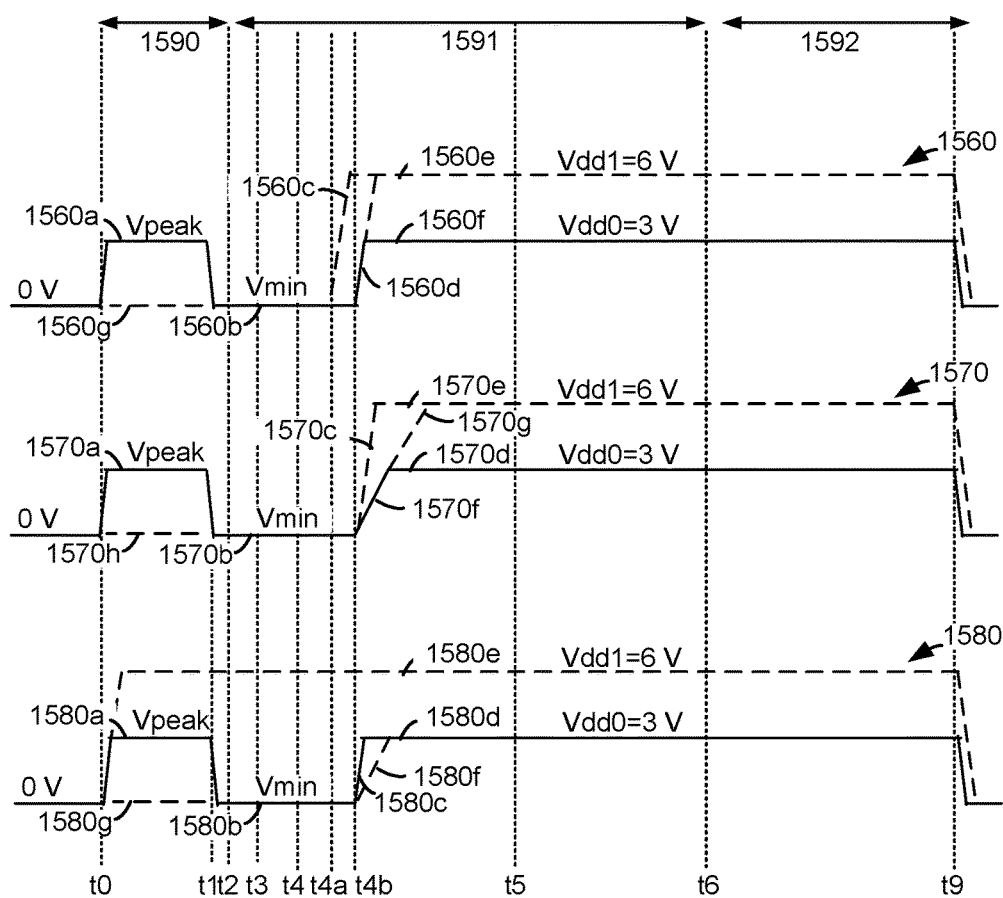
FIG. 15B depicts a plot of various voltages which can be used in a programming operation consistent with FIGS. 13A and 13B, where a ramp up of Vdd0 is delayed relative to a ramp up of Vwl.

The waveforms depicted in FIG. 15B help reduce the above-mentioned disturbs. In particular, the disturb of the dummy memory cell 845 which is adjacent to the SGD transistor 842 is more of a concern than the disturb of the dummy memory cell 846 which is adjacent to the drain-end data memory cell 847 or the drain-end data word line WLL10. This is because the disturb of the dummy memory cell 845 increases the disturb of the SGD transistor 842 but the SGD transistors are not normally erased in a block erase operation. In contrast, the dummy memory cells are typically erased in a block erase operation so that the disturbs are removed. Moreover, the disturb of the SGD transistor 842 increases the disturb of the dummy memory cell 845, so there is a feedback cycle of disturbs with these two adjacent transistors. The disturb of the dummy memory cell 846 is not part of this feedback cycle so it is less of a concern.

Figure 11:
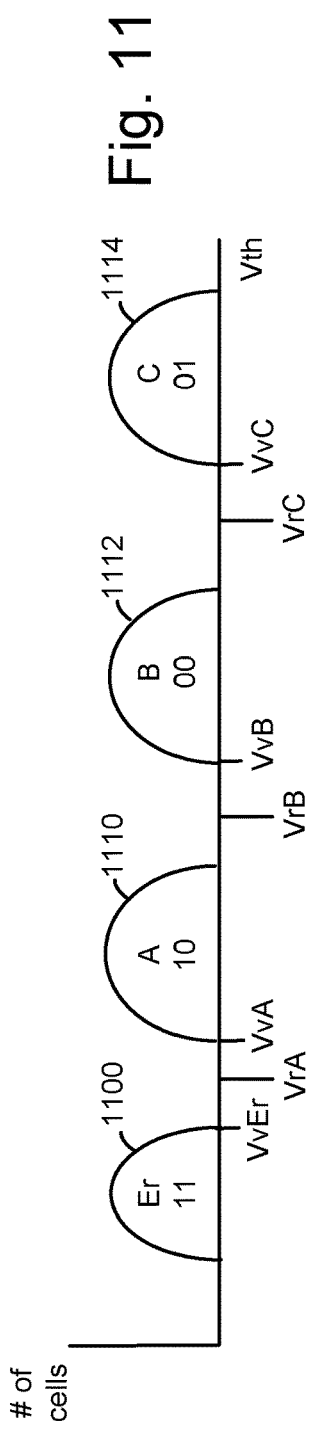
FIG. 11 depicts an example threshold voltage (Vth) distribution of a set of memory cells connected to a selected word line after a programming operation, where four data states are used.

FIG. 11 depicts an example threshold voltage (Vth) distribution of a set of memory cells connected to a selected word line after a programming operation, where four data states are used. A Vth distribution 1100 is provided for erased (Er) state memory cells. Three Vth distributions 1110, 1112 and 1114 represent assigned data states A, B and C, respectively, which are reached by memory cells when their Vth exceeds the verify voltage VvA, VvB or VvC, respectively. This example uses four data states. Other numbers of data states can be used as well, such as eight or sixteen. Read voltages VrA, VrB and VrC are used to read data from a set of cells having this Vth distribution. These verify voltages and read voltages are examples of control gate read levels of the selected word line voltage. VvEr is an erase-verify voltage for use in an erase operation.

During a programming operation, the final Vth distribution can be achieved by using one or more programming passes. Each pass may use incremental step pulse programming, for instance. During a programming pass, program loops are performed for a selected word line. A program loop comprises a program portion in which a program voltage is applied to the word line followed by a verify portion in which one or more verify tests are performed. Each programmed state has a verify voltage which is used in the verify test for the state.

A single-pass programming operation involves one sequence of multiple program-verify operations (or program loops) which are performed starting from an initial Vpgm level and proceeding to a final Vpgm level until the threshold voltages of a set of selected memory cells reach the verify voltages of the assigned data states. All memory cells may initially be in the erased state at the beginning of the programming pass. After the programming pass is completed, the data can be read from the memory cells using read voltages which are between the Vth distributions. At the same time, a read pass voltage, Vread pass (e.g., 9 V), also referred to as Vread, is applied to the remaining word lines. By testing whether the Vth of a given memory cell is above or below one or more of the read reference voltages, the system can determine the data state which is represented by a memory cell. These voltages are demarcation voltages because they demarcate between Vth ranges of different data states.

Moreover, the data which is programmed or read can be arranged in pages. For example, with four data states, or two bits per cell, two pages of data can be stored. An example encoding of bits for the Er, A, B and C states is 11, 10, 00 and 01, respectively, in the format of upper page (UP) bit/lower page (LP) bit. A lower page read may use VrA and VrC and an upper page read may use VrB.

Figure 12:
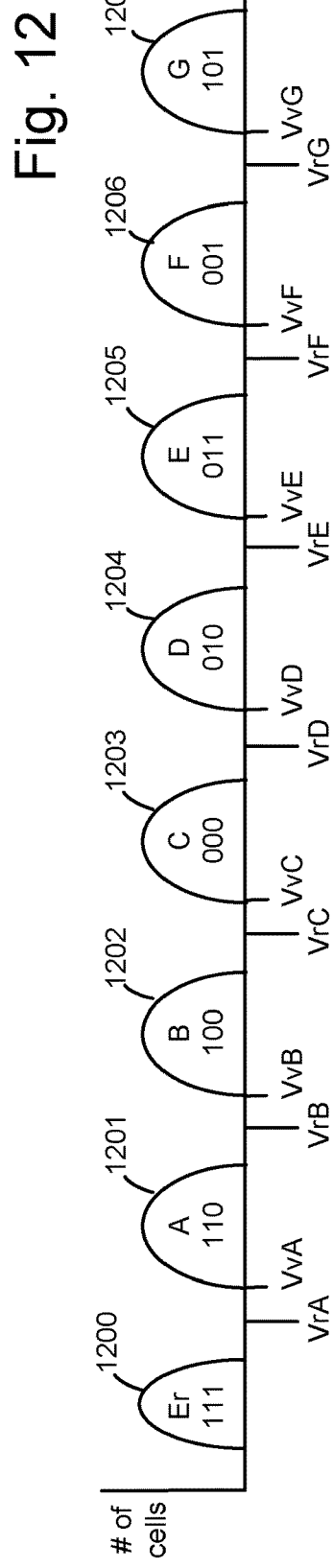
FIG. 12 depicts an example Vth distribution of a set of memory cells connected to a selected word line after a programming operation, where eight data states are used.

FIG. 12 depicts an example Vth distribution of a set of memory cells connected to a selected word line after a programming operation, where eight data states are used. Single-pass or multi-pass programming may be used to obtain this Vth distribution. Based on the write data as indicated, the cells which are to remain in the Er state are represented by the Vth distribution 1200. The cells which are to be programmed to the A, B, C, D, E, F and G states using verify voltages of VvA, VvB, VvC, VvD, VvE, VvF and VvG, respectively, are represented by the Vth distributions 1201, 1202, 1203, 1204, 1205, 1206 and 1207, respectively. Each data state represents three bits of data as indicated. Read voltages VrA, VrB, VrC, VrD, VrE, VrF and VrG can be used for reading the states of the cells in a read operation. These verify voltages and read voltages are examples of control gate read levels of the selected word line voltage. Other example programming operations may use additional data states and/or programming passes. For example, sixteen data state are possible.

With eight data states, or three bits per cell, three pages of data can be stored. An example encoding of bits for the A, B, C, D, E, F and G states is 111, 110, 100, 000, 010, 011, 001 and 101, respectively. The data of the lower page can be determined by reading the memory cells using read voltages of VrA and VrE. The data of the middle page can be determined by reading the memory cells using read voltages of VrB, VrD and VrF. The data of the upper page can be determined by reading the memory cells using read voltages of VrC and VrG.

Figure 13A:
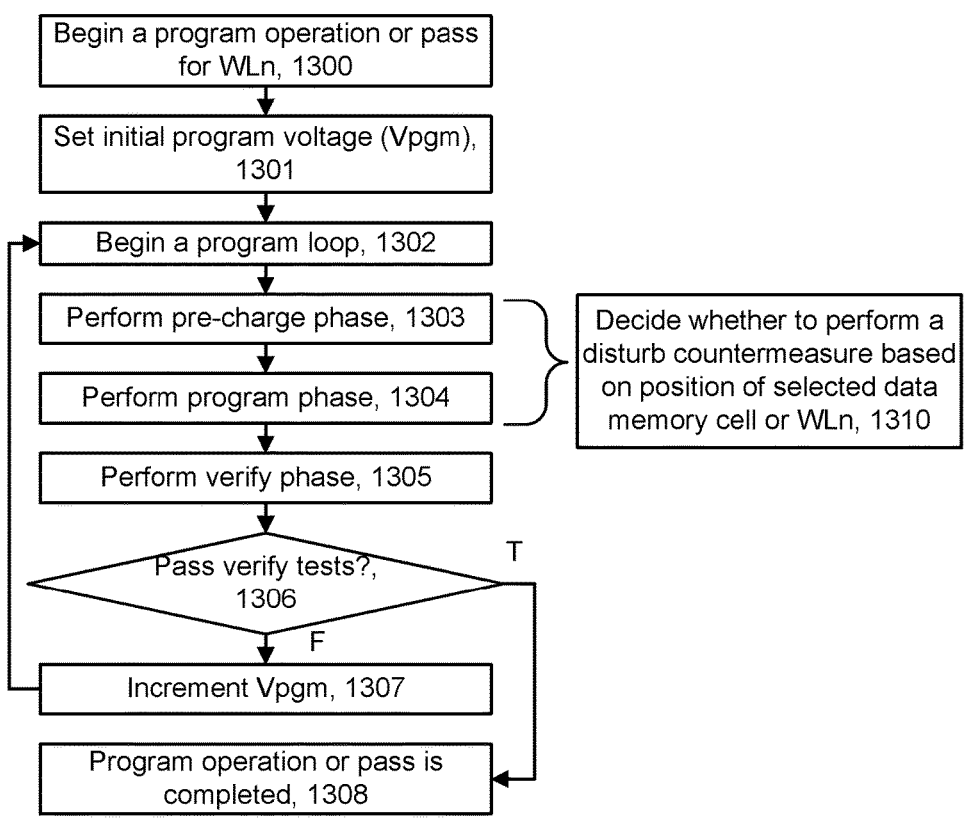
FIG. 13A depicts a process for programming data memory cells in which a disturb countermeasure can be implemented.

FIG. 13A depicts a process for programming data memory cells in which a disturb countermeasure can be implemented. See also FIGS. 15A and 15B. Step 1300 begins a program operation or pass. In one approach, a programming operation comprises one or more program passes. Step 1301 sets an initial program voltage (Vpgm). See, e.g., FIG. 14 and Vpgm_init. Step 1302 begins a program loop. Step 1303 performs a pre-charge phase. In this phase, a bit line voltage Vbl such as 2 V is passed to the channels of the selected and unselected memory strings. This provides some boosting of the channels and removes residue electrons to facilitate boosting in the program phase. Step 1304 includes performing a program phase. In this phase, a program voltage or pulse is applied to a selected word line and a pass voltage is applied to the unselected word lines (e.g., the unselected data and dummy word lines). The selected word line could be one of WL0-WL10 in FIG. 7 or 8, for instance. This step also includes setting a program or inhibit status for the memory cells connected to the selected word line. A cell with an inhibit status has the associated bit line of the memory string set to a high level, e.g., 2-3 V which inhibits programming. A cell with a program status has the associated bit line of the memory string set to a low level, e.g., 0 V, which allows programming.

Step 1305 includes performing a verify phase, e.g., one or more verify tests, for the selected memory cells. This can involve applying a voltage at one or more control gate read levels (e.g., plot 1501) to the selected memory cells via the selected word line while applying a voltage at a read pass level (e.g., plot 1500c) to unselected word lines while sensing the memory cells. The sensing of a memory cell can involve detecting a level of a current in the associated memory string. The verify test determines whether each selected memory cell is in a conductive or non-conductive state. A decision step 1306 determines whether the verify tests are passed. If decision step 1306 is true, the program operation or pass is completed at step 1308. If the decision step 1306 is false, step 1307 increments Vpgm, and another program loop begins at step 1302. In a given program loop, a verify test may be performed for one or more assigned data states. For each assigned data state, the corresponding verify test is passed if all, or nearly all, of the memory cells which have the assigned data state pass the verify test. For example, the verify test may be passed if all, or nearly all, of the memory cells which have the assigned data state have a Vth greater than the control gate read level. This may be indicated by a current in the memory string exceeding a specified level as measured by a decay in the bit line voltage.

Steps 1303 and 1304 can include deciding whether to perform a disturb countermeasure based on the position of the selected data memory cell among the data memory cells in a memory string (or, similarly, the position of the selected word line WLn among a set of word lines) (step 1310). In one approach, a disturb countermeasure is performed when a position of the selected data memory cell in the memory string is among a subset of memory cells adjacent to a source-end of the memory string, and the disturb countermeasure is not performed when the position of the selected data memory cell in the memory string is among a subset of memory cells adjacent to a drain-end of the memory string. See the example subsets 890 and 891 of FIG. 7. This avoids a negative impact to the channel boosting when the selected memory cell is near the drain-end of the memory string. Channel boosting tends to be more difficult in this situation because the capacitance of the portion of the channel on the drain side of the selected memory string is relatively small and is therefore harder to boost by capacitive coupling from a ramp up of the word line voltages. The disturb countermeasures such a delaying the ramp up of the dummy word line voltage may be less helpful in this situation and can therefore be omitted or reduced in strength.

In one option, a disturb countermeasure is performed in each program loop of a programming operation. However, other options are possible. For example, a disturb countermeasure can be performed for fewer than all program loops of a programming operation. Also, as mentioned, the disturb countermeasure can be performed during programming of fewer than all data word lines of a block.

Figure 13B:
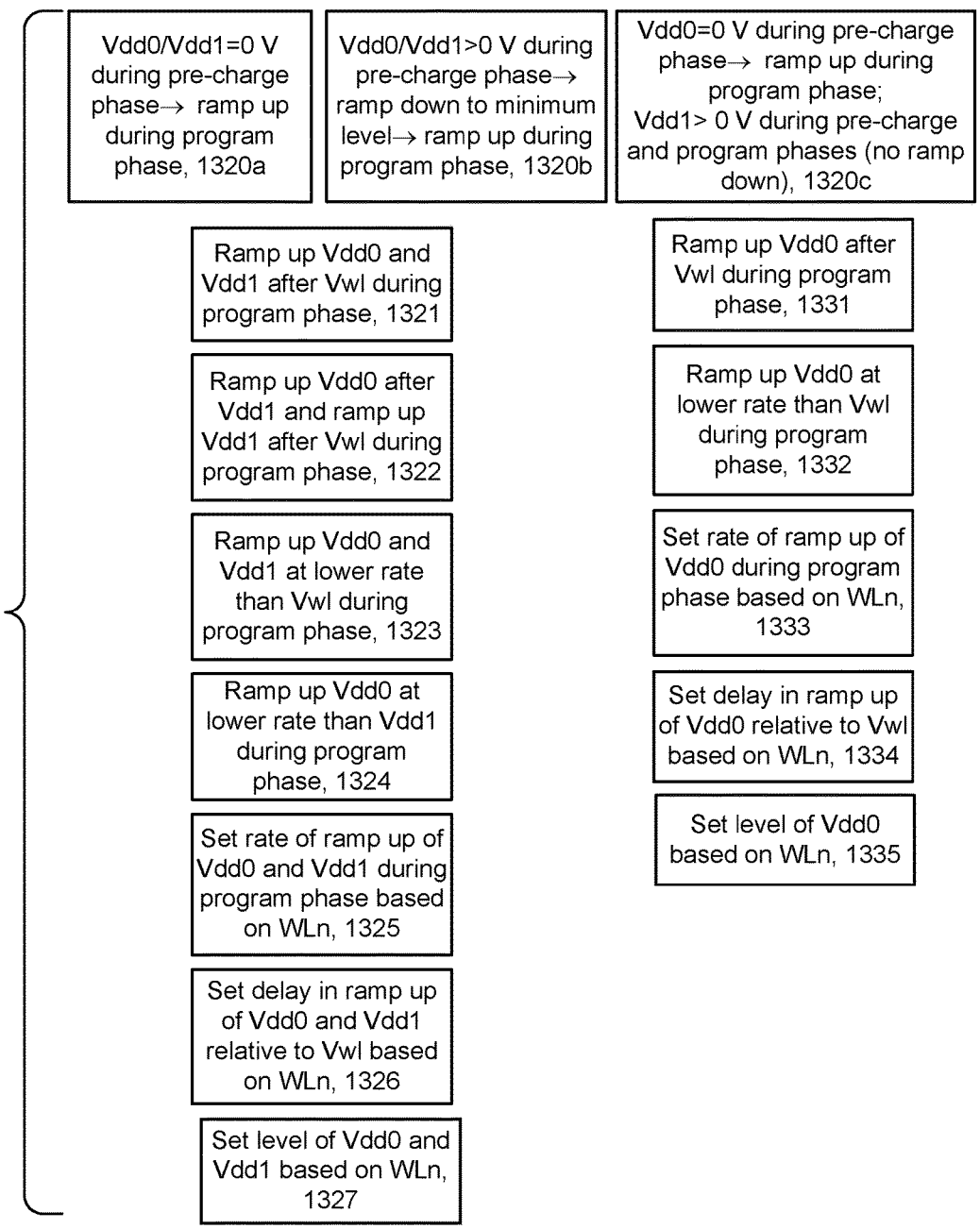
FIG. 13B depicts a plot of various scenarios in implementing the programming process of FIG. 13A.

FIG. 13B depicts a plot of various scenarios in implementing the programming process of FIG. 13A. Three different options are depicted in the top row. Block 1320a depicts a first option for: Vdd0/Vdd1=0 V during pre-charge phase (see plot 1520a in FIG. 15A) followed by a ramp up during program phase. This approach can provide sufficient boosting for the pre-charge phase is some situations. It also maximizes the channel coupling up in the pre-charge phase when Vwl is ramped up to Vpass. See also FIGS. 15A and 15B, where time periods t0-t2, t2-t6 and t6-t9 represent a pre-charge phase 1590, a program phase 1591 and a verify phase 1592, respectively.

Block 1320b depict a second option for: Vdd0/Vdd1>0 V (see plots 1530a, 1540a, 1550a, 1560a, 1570a, 1580a in FIGS. 15A and 15B) during pre-charge phase followed by ramp down to minimum level (see plots 1540b, 1560b, 1570b and 1580b) followed by a ramp up during the program phase. This approach can facilitate channel boosting by providing the dummy memory cells in a more strongly conductive state during the pre-charge. Also, by ramping down Vdd0/Vdd1 (Vdd0 and Vdd1), a large voltage swing is preserved when Vdd0/Vdd1 subsequently ramps up to maximize capacitive coupling up of the channels of the memory strings in the unselected sub-blocks and the channels of the unselected memory strings in the selected sub-blocks. However, the disturb problem mentioned at the outset can still occur without further countermeasures.

If Vdd0 and Vdd1 are not ramped down, as in plot 1530, the channel coupling up in the pre-charge phase is reduced when Vwl is ramped up to Vpass.

Block 1320c depicts a third option for: Vdd0=0 V during pre-charge phase see (plot 1520a in FIG. 15A) followed by a ramp up during the program phase, and Vdd1>0 V during the pre-charge and program phases (no ramp down) (see plot 1580e in FIG. 15B). This approach treats Vdd0 and Vdd1 differently, recognizing that the DD0 memory cell is adjacent to a SGD transistor and therefore has a special concern with disturbs, as mentioned. In one approach, Vdd0 is kept low, e.g., at 0 V, during the pre-charge phase while Vdd1 is elevated and can remain at an elevated level while transitioning from the pre-charge phase to the program phase. Vdd1 can remain at the elevated level (or more than one elevated, positive voltage) throughout all or most of the pre-charge and program phase. This approach helps reduce disturb on the SGD transistors while also avoiding a disturb of the last data memory cell, e.g., on WLL10 in the example of FIGS. 7 and 8.

One or more of the options of blocks 1321 to 1327 can be used in connection with blocks 1320a and 1320b. Block 1321 involves ramping up Vdd0 and Vdd1 after Vwl during the program phase. See FIG. 15B and plots 1560 and 1570. The start of the ramp up of Vdd0 and Vdd1 at t4b can be after the start of the ramp up of Vwl at t4 or even after the completion of the ramp up of Vwl. Vwl represents the voltages of the data word lines, including a selected data word line and unselected data word lines. In one approach, the data word lines are ramped up to Vpass together at a start of the program phase (at t4 in plot 1500) while Vwl_sel, the voltage of the selected data word line is subsequently ramped higher to a peak level of Vpgm (at t5 in plot 1500) in the program phase.

Block 1322 involves ramping up Vdd0 after ramping up Vdd1, and ramping up Vdd1 after ramping up Vwl, during the program phase. Vdd0 is also ramped up after ramping up Vwl. See FIG. 15B and plot 1560. The start of the ramp up of Vdd0 can be after the start of the ramp up of Vdd1 or even after the completion of the ramp up of Vdd1, and the start of the ramp up of Vdd1 can be after the start of the ramp up of Vwl or even after the completion of the ramp up of Vwl. The delay in ramping up Vdd0 allows time for the channel voltage of the SGD transistors to increase to an equilibrium state. The delay in ramping up Vdd1 can be less than the delay in ramping up Vdd0 as a compromise between reducing the disturb of the SGD transistor and avoiding a disturb of the WLDD10 data memory cell.

Block 1323 involves ramping up Vdd0 and Vdd1 at a lower rate than Vwl during the program phase. See FIG. 15B and plots 1570f and 1570g. Ramping up these voltages at a lower rate has a similar result as delaying the ramp up. In one option, Vdd0 and Vdd1 are ramped up concurrently at the lower rate. The lower rate may be the same for Vdd0 and Vdd1, in one approach. The start of the ramping up of Vdd0 and Vdd1 can be after, or even concurrent with, the start of the ramping up of Vwl.

Block 1324 involves ramping up Vdd0 at a lower rate than Vdd1 during the program phase. See FIG. 15B and plots 1570f and 1570c. The ramp up rate of Vdd1 can be lower than, or the same as, the ramp up rate of Vwl during the program phase, for instance. The ramping up Vdd0 can be concurrent with (as shown in plot 1570) or after the ramping up of Vdd1.

Block 1325 sets the ramp up rate of Vdd0 and Vdd1 during the program phase based on the WLn position. See FIG. 16B. For example, the ramp up rate can be relatively lower when WLn is relatively close to the source-end of the memory strings.

Block 1326 sets the delay in the ramp up of Vdd0 and Vdd1 relative to the ramp up in Vwl based on the WLn position during the program phase. See FIG. 16A. For example, the delay can be relatively higher when WLn is relatively close to the source-end of the memory strings.

Block 1327 sets the level (magnitude) of Vdd0 and Vdd1 during the pre-charge phase based on the WLn position. See FIG. 16C. For example, the level can be relatively higher when WLn is relatively close to the source-end of the memory strings. Using a higher level for Vdd0 and Vdd1 can increase the channel boosting level during the pre-charge phase. The level is reduced for programming the higher word lines, closer to the drain-end of the memory strings. As mentioned, this avoids a negative impact to the channel boosting when the selected memory cell is near the drain-end of the memory string.

One or more of the options of blocks 1331 to 1335 can be used in connection with block 1320c. Block 1331 involves ramping up Vdd0 after ramping up Vwl, during the program phase. A ramp up in Vdd1 may be avoided by keeping Vdd1 at an elevated level as stated at block 1320c. See plot 1580.

Block 1332 involves ramping up Vdd0 at a lower rate than Vwl during the program phase. See plot 1580f.

Block 1333 sets the ramp up rate of Vdd0 during the program phase based on the WLn position. For example, the ramp up rate can be relatively lower when WLn is relatively close to the source-end of the memory strings. See FIG. 16B.

Block 1334 sets the delay in the ramp up of Vdd0 relative to the ramp up in Vwl based on the WLn position during the program phase. For example, the delay (t4b-t4 in FIG. 15B) can be relatively higher when WLn is relatively close to the source-end of the memory strings. See FIG. 16A.

Block 1335 sets the level of Vdd0 during the pre-charge phase based on the WLn position. For example, the level can be relatively higher when WLn is relatively close to the source-end of the memory strings. See FIG. 16C.

FIG. 14 depicts a series of program loops in an example programming operation, consistent with FIG. 13A. The pulse train 1400 includes a series of program pulses 1401-1415 that are applied to a word line selected for programming. The pulse train 1400 is an example of a second set of step-wise increasing program voltages. A pulse train typically includes program pulses which increase stepwise in amplitude in one or more program loops or program loops of a programming pass using a fixed or varying step size. In some cases, the program pulses increase in each program loop after the first. A new pulse train can be applied in each programming pass, starting at an initial level and ending at a final level which does not exceed a maximum allowed level. The initial levels can be the same or different in different programming passes. The final levels can also be the same or different in different programming passes. The step size can be the same or different in the different programming passes. In some cases, a smaller step size is used in a final programming pass to reduce Vth distribution widths.

Vpgm_init is the initial program voltage. One, two or three verify pulses are provided after each program pulse as an example, based on the assigned data states which are being verified. For example, an A-state verify pulse 1420 (VvA) is applied in program loops 1-3, A-state and B-state verify pulses 1421 (VvA and VvB, respectively) are applied in program loops 4-6, A-state, B-state and C-state verify pulses 1422 (VvA, VvB and VvC, respectively) are applied in program loops 7 and 8, B-state and C-state verify pulses 1423 are applied in program loops 9-11, and a C-state verify pulse 1424 is applied in program loops 12-15.

FIG. 15A depicts plots of various voltages which can be used in a programming operation consistent with FIGS. 13A and 13B, where a ramp up of Vdd0 is concurrent with a ramp up of Vwl. The vertical dimension denotes voltage and the horizontal dimension denotes time. The period of time depicted corresponds to one program loop. In the pre-charge phase 1590, a positive voltage (Vbl) is provided to the channels of the memory strings to remove residue electrons and to provide a small amount of boosting such as 1-2 V. The SGD transistors are in a strongly conductive state at this time. In the program phase 1591, the data word line voltages are ramped up. In one approach, the selected and unselected data word line voltages are ramped up at the same time (starting at t4) to a pass voltage level, Vpass. This ramp up provides a capacitive coupling up of the channels of the memory strings in the unselected blocks. The selected data word line voltage is then ramped up further (starting at t5) to the peak level of Vpgm. In the verify phase 1592, one or more verify tests are performed by applying one or more control gate read voltages on WLn and, for each read voltage, sensing the conductive state of the memory cells in the selected strings of the selected sub-block.

A plot 1500 depicts voltages on a selected word line and unselected word lines. Plot 1500a is used during the pre-charge phase for the data word lines. Plots 1500b and 1500d are used for the selected word line during the program phase. Plots 1500b and 1500c are used for the unselected word lines during the program phase. At the end of the program phase, the voltages of the selected data word line start to ramp down at t6, e.g., to 0 V. At the end of the verify phase, the voltages of the unselected data word lines start to ramp down at t9, e.g., to 0 V.

Plot 1501 is used on the selected word lines during the verify phase. In this example, the verify test uses VvA from t7-t8 and VvB from t8-t9.

A plot 1510 depicts one example of voltages Vsgd_sel and Vsgd_unsel on the SGD transistors of selected and unselected sub-blocks, respectively. In the pre-charge phase, Vsgd_sel and Vsgd_unsel are set to a fairly high level such as 6 V (plot 1510*a*) which provides the SGD transistors in a strongly conductive state. This allows the bit line voltage to be passed to the channel. Vsgd_sel is then decreased to a reduced level such as 2.5 V (plot 1510*b*) which is still high enough to provide the SGD_sel transistors in a conductive state for the selected memory strings in the selected sub-block. However, it is low enough that the SGD_sel transistors can be provided in a non-conductive state for the locked out memory strings in the selected sub-block, by raising Vbl for those memory strings. Thus, the drain-end select gate transistor is in a conductive state during the pre-charge phase and the program phase, for the selected memory strings. Vsgd_unsel is decreased to a reduced level such as 0 V (plot 1510*c*) which provides the SGD unsel transistors in a non-conductive state for the memory strings in the unselected sub-blocks.

A plot 1520 depicts one example of voltages Vdd0 and Vdd1 on the dummy word lines. Vdd0 and Vdd1=0 V during the pre-charge phase (plot 1520). During the program phase, Vdd0 and Vdd1 are ramped up starting at t4 to relatively low and high levels such as 3 V and 6 V, respectively (plots 1520*c* and 1520*b*, respectively). Plots 1520, 1530, 1540, 1560, 1570 and 1580 provided an example of a technique in which, in the program phase, a peak level to which the voltage of the second dummy memory cell is ramped up (e.g., 6 V) is higher than a peak level to which the voltage of the first dummy memory cell is ramped up (e.g., 3 V).

A plot 1530 depicts another example of the voltages Vdd0 and Vdd1. Vdd0 and Vdd1 are set to a moderate, positive level such as 2.5 V during the pre-charge phase (plot 1530*a*). During the program phase, Vdd0 and Vdd1 are ramped up starting at t4 from the moderate level to 3 V and 6 V, respectively (plots 1530*c* and 1530*b*, respectively).

A plot 1540 depicts another example of the voltages Vdd0 and Vdd1. Vdd0 and Vdd1 are set to a moderate, positive level such as 2.5 V during the pre-charge phase (plot 1540*a*) and then ramped back down, e.g., to 0 V (plot 1540*b*). The ramp down can begin at t1, before the ramp down of Vsgd a t4. During the program phase, Vdd0 and Vdd1 are ramped up starting at t4 from 0 V to 3 V and 6 V, respectively (plots 1540*d* and 1540*c*, respectively).

A plot 1550 depicts an example of Vbl, bit line voltage. In the pre-charge phase, Vbl is ramped up to a positive level such as 2 V (plot 1550*a*). Vbl can then be kept at the positive level during the pre-charge phase (plot 1550*b*) for the unselected memory strings which are locked out from programming in the current program loop. Vbl can be lowered to 0 V (plot 1550*c*) for the selected memory strings which are not locked out from programming in the current program loop.

FIG. 15B depicts a plot of various voltages which can be used in a programming operation consistent with FIGS. 13A and 13B, where a ramp up of Vdd0 is delayed relative to a ramp up of Vwl. The time line is the same as in FIG. 15A except that additional time points t4*a* and t4*b* are added after t4 and before t5. A plot 1560 depicts another example of the voltages Vdd0 and Vdd1. Vdd0 and Vdd1 are set to a moderate, positive level Vpeak, such as 2.5 V, during the pre-charge phase (plot 1560*a*) and then ramped back down, e.g., to 0 V or other minimum level (plot 1560*b*). During the program phase, Vdd1 is ramped up starting at t4*a* from 0 V to a higher level such as 6 V (plot 1560*c*) and kept at this higher level during the program phase and the verify phase (plot 1560*e*). This is after the ramp up of the voltage of the data word lines at t4. Vdd0 is ramped up starting at t4*b* from 0 V to a lower level such as 3 V (plot 1560*d*) and kept at this higher level during the program phase and the verify phase (plot 15600. This is after the ramp up of Vdd1. In one option, as shown, the ramp up rate is the same for Vdd1 and Vdd0 at t4*a* and t4*b*, respectively.

A plot 1570 depicts another example of the voltages Vdd0 and Vdd1. Vdd0 and Vdd1 are set to a moderate, positive level Vpeak, such as 2.5 V, during the pre-charge phase (plot 1570*a*) and then ramped back down, e.g., to 0 V or other minimum level (plot 1570*b*). During the program phase, Vdd1 is ramped up starting at t4*b* from 0 V to a higher level such as 6 V (plot 1570*c*, or plots 1570*f* and 1570*g*) and kept at this higher level during the program phase and the verify phase (plot 1570*e*). This is after the ramp up of the voltage of the data word lines at t4. Vdd0 is also ramped up starting at t4*b* from 0 V to a lower level such as 3 V (plot 15700 and kept at this higher level during the program phase and the verify phase (plot 1570*d*). This is the same time as the ramp up of Vdd1. In one option, the ramp up rate is lower for Vdd0 (plot 15700 than for Vdd1 (plot 1570*c*). In another option, the ramp up rate is the same for Vdd0 (plot 15700 and Vdd1 (plot 1570*f* and 1570*g*).

A plot 1580 depicts another example of the voltages Vdd0 and Vdd1. Vdd0 is ramped up to a moderate, positive level Vpeak, such as 2.5 V, during the pre-charge phase (plot 1580*a*) and then ramped back down, e.g., to 0 V or other minimum level (plot 1580*b*). During the program phase, Vdd0 is ramped up starting at t4*b* from 0 V to a higher level such as 3 V (plot 1580*c*) and kept at this level during the program phase and the verify phase (plot 1580*d*). In contrast, Vdd0 is ramped up to a relatively high level such as 6 V, during the pre-charge phase (plot 1580*e*) and kept at this level during the program phase and the verify phase.

Plot 1580 provides an example of a technique in which, in the pre-charge phase, a peak level to which the voltage of the second dummy memory cell is ramped up (e.g., 6 V) is higher than a peak level to which the voltage of the first dummy memory cell is ramped up (e.g., Vpeak such as 2.5 V).

Plots 1540, 1560, 1570 and 1580 provide an example of a technique in which a control circuit is configured to provide the voltage of the first dummy memory cell at a first positive peak level (e.g., 2.5 V or Vpeak) during the pre-charge phase, and then lower the voltage of the first dummy memory cell from the first positive peak level to a minimum level (e.g., 0 V or Vmin) before the ramp up of the voltage of the first dummy memory cell in the program phase.

FIG. 16C shows that the first positive peak level can be relatively lower when the selected data memory cell is relatively close to the drain-end of the memory string.

Plot 1580 provides an example of a technique in which a control circuit is configured to provide a voltage of the second dummy memory cell at a second positive peak level (e.g., 6 V) during the pre-charge phase and the program phase without lowering the voltage of the second dummy memory cell when the voltage of the first dummy memory cell is lowered from the first positive peak level (Vpeak) to the minimum level. In this technique, the second positive peak level can be greater than the first positive peak level.

FIG. 16C provides an example of a technique in which the performing the pre-charge phase comprises biasing the drain-end at a positive voltage (Vbl) while providing a voltage of the first dummy memory cell at a first specified level (Vdd0_pre), wherein the first specified level is based on a position (WLn) of the selected data memory cell in the memory string. The first specified level is a positive voltage (see plots 1540*a*, 1560*a*, 1570*a* and 1580*a*) and is relatively high when the selected data memory cell is relatively far (WLn<=WLx) from the drain-end of the memory string, and the first specified level is a ground voltage (see plots 1560*g*, 1570*h* and 1580*g*) when the selected data memory cell is relatively close (WLn>WLx1) to the drain-end of the memory string. The technique further includes providing a voltage of a second dummy memory cell at a second specified level (Vdd1_pre) which is greater than the first specified level while the voltage of the first dummy memory cell is provided at the first specified level (Vdd0_pre).

In the approaches of FIG. 15B, first, all drain-end dummy word line voltages are increased to a certain level which high enough to provide a sufficient channel pre-charge. Before Vsgd decreases at t2, the dummy word line voltage decreases at t1 back to 0 V or other sufficiently low level (e.g., low enough to provide a large voltage swing in the program phase). After the pre-charge phase is completed, the dummy word line voltages do not ramp up together with the data word line voltages. Instead, the dummy word line voltages ramp up with a certain delay (e.g., several microseconds) after the data word line voltages ramp up. In this way, when Vsgd_unsel in the unselected subblocks ramps down to 0 V at t2 (plot 1510), and the channel voltage of these SGD transistors is pushed to a negative level, the DD0 channel potential is not lifted up immediately. During the delay, holes will be generated inside the polysilicon channel and move to the channel portion of the SGD transistor. This will increase the channel potential there. When Vdd0 and the associated channel potential start to increase at t4, the SGD channel potential is less negative than it would be without the delay. In this way, channel potential difference between DD0 and SGD and the electron injection to DD0 can be reduced. During the delay to ramp up Vdd0, the SGD channel potential recovers from the negative level. However, the data word line voltages can be ramped up without being delayed, ensuring that boosting during the program phase is not delayed and therefore there is no penalty in the overall programming time.

A potential disadvantage to the delay is that, when the voltage of the last, drain-end data word line ramps up, the channel voltage of the neighboring dummy word line may still be low. In this case, injection disturb can occur in the memory cells of the drain-end data word line. One solution is to keep the voltage high on the dummy word line WLDD1 which is adjacent to the drain-end data word line. This helps reduce the injection type of disturb on the drain-end data word line when data word line voltages ramp up in the program phase. Instead, the injection disturb may occur more easily on WLDD1 when Vdd0 decreases at the end of the pre-charge phase. However, since the dummy memory cells are typically erased during the normal block erase of a program-erase cycle, the injection disturb there will not cause a negative impact.

Regarding FIG. 16A to 16C, as mentioned, the disturb countermeasures can be omitted or weakened when the selected word line is close to the drain-end of the block or memory strings. Tests indicate that when very high (drain-end) word lines are programmed, if the drain-end dummy word line voltages are ramped up during the pre-charge phase, such as shown by plots 1530*a*, 1540*a*, 1560*a*, 1570*a* and 1580*a*, the channel boosting potential will have a negative impact in the program phase. This negative impact may occur regardless of whether the drain-end dummy word line voltages are ramped back down after the pre-charge phase. One solution is to reduce or omit the ramp up of the drain-end dummy word line voltages during the pre-charge phase as shown in FIG. 16C.

It is also possible to reduce or omit the delay in the ramp up, or the reduction in the ramp up rate, for the drain-end dummy word line voltages in the program phase, as shown in FIGS. 16A and 16B, respectively. This can help avoid a potential reduction in channel boosting. As mentioned, channel boosting tends to be more difficult when the capacitance of the portion of the channel on the drain side of the selected memory string is relatively small and is therefore harder to boost by capacitive coupling from a ramp up of the word line voltages. Omitting or reducing the delay in the ramp up, or the reduction in the ramp up rate, can help avoid a reduction in channel boosting when seeking to reduce disturbs of the dummy memory cells and SGD transistors.

It is also possible to implement one or more, but not all of, the solutions of FIG. 16A to 16C. For example, the voltages during pre-charge can be attenuated as in FIG. 16A without the delay in the ramp up, or the reduction in the ramp up rate, as in FIG. 16A and a 16B, respectively. Or, the voltages during pre-charge can be attenuated as in FIG. 16A, and the ramp up rate can be attenuated as in FIG. 16B, while keeping the delay in the ramp up at a fixed level independent of WLn. Other variations are possible as well.

FIG. 16A depicts a plot of a delay in the ramp up of the voltage of a dummy word line relative to a ramp up of the voltage of data word lines during the program phase of a program loop, as a function of a selected word line WLn position, consistent with FIGS. 13A and 13B. The delay for DD0 and DD1 is tdd0 and tdd1, respectively. DD1 denotes WLDD1 or the dummy memory cell 846, for instance. The delay can be based on the start of the ramp up. The vertical axis represents a delay and the horizontal axis represents the selected word line position WLn. WLn can range from the source-end to a drain-end of a set of word lines or a block, e.g., from WLL0 to WLL10 in the case of eleven word lines or from WLL0-WLL63 in the case of 64 word lines. WLx denotes a word line position at which a transition in the delay occurs. WLx1 denotes a word line position between WLx and the drain-end, and WLx2 denotes a word line position between WLx1 and the drain end.

Plot 1600 shows that tdd0 is at a maximum level when WLn is between the source-end and WLx, then begins to decrease as WLn is further on the drain side of WLx. tdd0 may reach 0 V when WLn=WLx2, in one approach, in which case the disturb countermeasure of providing the delay is no longer used. Plot 1602 shows that tdd1 is at a maximum, but lower than the maximum of tdd0, when WLn is between the source-end and WLx, then begins to decrease as WLn is further on the drain side of WLx (WLn>WLx). tdd1 may reach 0 V when WLn=WLx1, in one approach, in which case the disturb countermeasure of providing the delay is no longer used. Other options are possible. For example, the maximum value of tdd0 and tdd1 may be the same. Also, the transition word line can be different for tdd0 and tdd1. Also, WLx1 can be the same as or different than WLx2. WLx1 and WLx2 can also be customized for tdd0 and tdd1. In another option, one or more steps can be used in the transition of tdd0 and tdd1 rather than a gradual change as shown. Also, tdd0 and/or tdd1 can reach a minimum level which is a positive value instead of 0 V as WLn>WLx.

FIG. 16A provides an example of a technique in which, in the program phase, a delay (tdd0) between a start of the ramp up of the voltage of the first dummy memory cell after the start of the ramp up of the voltage of the second dummy memory cell is relatively larger when the selected data memory cell is relatively further from the drain-end of the memory string.

FIG. 16B depicts a plot of a ramp up rate for the ramp up of a voltage of a dummy word line and data word lines during the program phase of a program loop, as a function of a selected word line WLn position, consistent with FIGS. 13A and 13B. The ramp up rate for the data word lines, DD0 and DD1 is rWLdata, rdd0 and rdd1, respectively. In one approach, rWLdata is greater than rdd1 and rdd0. The vertical axis represents the rate and the horizontal axis represents the selected word line position WLn. WLn can range from the source-end to a drain-end of a set of word lines or a block. WLx denotes a word line position at which a transition in the delay occurs.

Plot 1610 shows that rWLdata is independent of WLn, in one approach. rdd1 and rdd0 can also be independent of WLn (plot 1612) for WLn>WLx and they can decrease when the selected word line is closer to the source-end on the source side of WLx (WLn<WLx) Moreover, this decrease can be greater for rdd0 (plot 1614) than rdd1 (plot 1613), in one approach. Lowering the ramp up rate has a similar effect as increasing the delay, as mentioned. Other options are possible. For example, the transition word line can be different for rdd0 and rdd1.

FIG. 16C depicts a plot of a voltage of a dummy word line during the pre-charge of a program phase, as a function of a selected word line WLn position, consistent with FIGS. 13A and 13B. The maximum level of the pre-charge voltage for DD0 and DD1 is Vdd0_pre and Vdd1_pre, respectively. The vertical axis represents the voltage and the horizontal axis represents the selected word line position WLn. WLn can range from the source-end to a drain-end of a set of word lines or a block. WLx denotes a word line position at which a transition in the voltage occurs.

Plot 1620 shows an option in which Vdd1 is at a maximum level when WLn<=WLx, then decreases when WLn>WLx, eventually reaching 0 V at WLx2. Plot 1622 shows an option in which Vdd0_pre is at a maximum level (which is less than the maximum level of Vdd1) when WLn<=WLx then decreases when WLn>WLx, eventually reaching 0 V at WLx1.

Other options are possible. For example, the maximum levels of Vdd0_pre and Vdd1_pre may be the same. Also, the transition word line can be different for Vdd0_pre and Vdd1_pre. Also, WLx1 can be the same as or different than WLx2. In another option, one or more steps can be used in the transition of the pre-charge values of Vdd0_pre and Vdd1_pre rather than a gradual change as shown for WLn>WLx. Also, the pre-charge values of Vdd0_pre and/or Vdd1_pre can reach a minimum level which is a positive voltage instead of 0 V as WLn>WLx.

In one implementation, an apparatus comprises: a memory string comprising a drain-end select gate transistor at a drain-end of the memory string, a selected data memory cell, unselected data memory cells, and a first dummy memory cell adjacent to the drain-end select gate transistor; a bit line connected to the drain-end; and a control circuit. The control circuit is configured to, in a program loop for the selected data memory cell: perform a pre-charge phase in which the bit line has a positive voltage and the drain-end select gate transistor is in a conductive state; and after the pre-charge phase, perform a program phase in which, before a program pulse is applied to the selected data memory cell, a start of a ramp up of a voltage of the first dummy memory cell is after a start of a ramp up of a voltage of the unselected data memory cells when a position of the selected data memory cell in the memory string is among a subset of memory cells adjacent to a source-end of the memory string.

In another implementation, a method comprises: performing a pre-charge phase of a program loop for a memory string, the memory string comprising a drain-end select gate transistor at a drain-end of the memory string, a selected data memory cell, unselected data memory cells, and a first dummy memory cell adjacent to the drain-end select gate transistor, the performing the pre-charge phase comprises biasing the drain-end at a positive voltage while providing a voltage of the first dummy memory cell at a first specified level, wherein the first specified level is based on a position of the selected data memory cell in the memory string; and after the pre-charge phase, performing a program phase of the program loop.

In another implementation, an apparatus comprises: a memory string comprising a channel, a drain-end select gate transistor at a drain-end of the memory string, a non-data memory cell adjacent to the drain-end select gate transistor, a selected data memory cell and an unselected data memory cell; means for biasing the channel with a positive voltage in a first time period; means for applying a voltage at a first positive level to the non-data memory cell during the first time period; means for lowering the voltage of the non-data memory cell from the first positive level to a minimum level; means for increasing the voltage of the non-data memory cell from the minimum level to second positive level in a second time period; and means for increasing a voltage of the unselected data memory cell in the second time period before the increasing of the voltage of the non-data memory cell. The apparatus can further include means for increasing a voltage of the selected data memory cell in the second time period before the increasing of the voltage of the non-data memory cell.

The means for biasing the channel may include the bit line voltage driver 440 of FIG. 4, the control circuitry 110 and the controller 122, or other logic hardware, and/or other executable code stored on a computer readable storage medium or device. Other embodiments may include similar or equivalent means.

The means for applying, lowering and increasing the voltage of the non-data memory cell and for lowering the voltage of the non-data memory cell, may include the DD0 dummy word line driver 447b of FIG. 4, the control circuitry 110 and the controller 122, or other logic hardware, and/or other executable code stored on a computer readable storage medium or device. Other embodiments may include similar or equivalent means.

The means for increasing the voltage of the unselected data memory cell may include the power control module 116, the unselected data word line voltage driver 447a, the control circuitry 110 and the controller 122, or other logic hardware, and/or other executable code stored on a computer readable storage medium or device. Other embodiments may include similar or equivalent means.

The foregoing detailed description of the invention has been presented for purposes of illustration and description. It is not intended to be exhaustive or to limit the invention to the precise form disclosed. Many modifications and variations are possible in light of the above teachings. The described embodiments were chosen in order to best explain the principles of the invention and its practical application, to thereby enable others skilled in the art to best utilize the invention in various embodiments and with various modifications as are suited to the particular use contemplated. It is intended that the scope of the invention be defined by the claims appended hereto.

We claim:

1. An apparatus, comprising:
    a NAND string comprising a drain-end select gate transistor at a drain-end of the NAND string, a selected data memory cell, unselected data memory cells, and a first dummy memory cell adjacent to the drain-end select gate transistor;
    a bit line connected to the drain-end; and
    a control circuit configured to, in a program loop for the selected data memory cell:
        perform a pre-charge phase in which the bit line has a positive voltage and the drain-end select gate transistor is in a conductive state; and
    after the pre-charge phase, perform a program phase in which, before a program pulse is applied to the selected data memory cell, a start of a ramp up of a voltage of the first dummy memory cell is after a start of a ramp up of a voltage of the unselected data memory cells when a position of the selected data memory cell in the NAND string is among a subset of memory cells adjacent to a source-end of the NAND string, wherein the control circuit is configured to provide the voltage of the first dummy memory cell at a first positive peak level during the pre-charge phase, and then lower the voltage of the first dummy memory cell from the first positive peak level to a minimum level before the ramp up of the voltage of the first dummy memory cell in the program phase.

2. The apparatus of claim 1, wherein:
    the start of the ramp up of the voltage of the first dummy memory cell is concurrent with the start of the ramp up of the voltage of the unselected data memory cells when the position of the selected data memory cell in the NAND string is among a subset of memory cells adjacent to the drain-end of the NAND string.

3. The apparatus of claim 1, wherein:
    a rate of the ramp up of the voltage of the first dummy memory cell is lower than a rate of the ramp up of the voltage of the unselected data memory cells.

4. The apparatus of claim 1, wherein:
    a delay between the start of the ramp up of the voltage of the first dummy memory cell and the start of the ramp up of the voltage of the unselected data memory cells is relatively larger when the selected data memory cell is relatively further from the drain-end of the NAND string.

5. The apparatus of claim 1, further comprising:
    a second dummy memory cell adjacent to the first dummy memory cell; and
    wherein the control circuit is configured to, in the program phase, start a ramp up of a voltage of the second dummy memory cell before the start of the ramp up of the voltage of the first dummy memory cell, and after the start of the ramp up of the voltage of the unselected data memory cells.

6. The apparatus of claim 1, further comprising:
    a second dummy memory cell adjacent to the first dummy memory cell; and
    wherein the control circuit is configured to, in the program phase, provide a rate of the ramp up for the voltage of the first dummy memory cell which is lower than a rate of a ramp up of a voltage of the second dummy memory cell.

7. The apparatus of claim 6, wherein:
    the rate of the ramp up for the voltage of the first dummy memory cell is lower than a rate of the ramp up of the voltage of the unselected data memory cells.

8. The apparatus of claim 1, further comprising:
    a second dummy memory cell adjacent to the first dummy memory cell; and
    wherein, in the program phase, a peak level to which a voltage of the second dummy memory cell is ramped up is higher than a peak level to which the voltage of the first dummy memory cell is ramped up.

9. The apparatus of claim 1, further comprising:
    a second dummy memory cell adjacent to the first dummy memory cell; and
    wherein, in the program phase, a delay between a start of the ramp up of the voltage of the first dummy memory cell after the start of the ramp up of a voltage of the second dummy memory cell is relatively larger when the selected data memory cell is relatively further from the drain-end of the NAND string.

10. The apparatus of claim 1, further comprising:
    a second dummy memory cell adjacent to the first dummy memory cell; and
    wherein, in the pre-charge phase, a peak level to which a voltage of the second dummy memory cell is ramped up is higher than a peak level to which the voltage of the first dummy memory cell is ramped up.

11. The apparatus of claim 1, wherein:
    the first positive peak level is relatively lower when the selected data memory cell is relatively close to the drain-end of the NAND string.

12. The apparatus of claim 1, further comprising:
    a second dummy memory cell adjacent to the first dummy memory cell; and
    wherein the control circuit is configured to provide a voltage of the second dummy memory cell at a second positive peak level during the pre-charge phase and the program phase without lowering the voltage of the second dummy memory cell when the voltage of the first dummy memory cell is lowered from the first positive peak level to the minimum level.

13. The apparatus of claim 12, wherein:
    the second positive peak level is greater than the first positive peak level.

14. An apparatus, comprising:
    a NAND string comprising a channel, a drain-end select gate transistor at a drain-end of the NAND string, a non-data memory cell adjacent to the drain-end select gate transistor, a selected data memory cell and an unselected data memory cell;
    means for biasing the channel with a positive voltage in a first time period;
    means for applying a voltage at a first positive level to the non-data memory cell during the first time period;
    means for lowering the voltage of the non-data memory cell from the first positive level to a minimum level;
    means for increasing the voltage of the non-data memory cell from the minimum level to a second positive level in a second time period; and
    means for increasing a voltage of the unselected data memory cell in the second time period before the increasing of the voltage of the non-data memory cell.

15. The apparatus of claim 14, further comprising:
means for increasing a voltage of the selected data memory cell in the second time period before the increasing of the voltage of the non-data memory cell.

16. An apparatus, comprising:
a NAND string comprising a drain-end select gate transistor at a drain-end of the NAND string, a selected data memory cell, unselected data memory cells, a first dummy memory cell adjacent to the drain-end select gate transistor, and a second dummy memory cell adjacent to the first dummy memory cell;
a bit line connected to the drain-end; and
a control circuit configured to, in a program loop for the selected data memory cell:
  perform a pre-charge phase in which the bit line has a positive voltage and the drain-end select gate transistor is in a conductive state; and
after the pre-charge phase, perform a program phase in which, before a program pulse is applied to the selected data memory cell, a start of a ramp up of a voltage of the first dummy memory cell is after a start of a ramp up of a voltage of the unselected data memory cells when a position of the selected data memory cell in the NAND string is among a subset of memory cells adjacent to a source-end of the NAND string, wherein the control circuit is configured to, in the program phase, provide a rate of the ramp up for the voltage of the first dummy memory cell which is lower than a rate of a ramp up of a voltage of the second dummy memory cell.

* * * * *